United States Patent
Jha et al.

(10) Patent No.: US 11,169,740 B1
(45) Date of Patent: Nov. 9, 2021

(54) SIMULTANEOUS INITIATION OF MULTIPLE COMMANDS FOR CONFIGURING MULTI-MODE DIMMS USING A BMC

(71) Applicant: AMERICAN MEGATRENDS INTERNATIONAL, LLC, Norcross, GA (US)

(72) Inventors: Manish Jha, Norcross, GA (US); Harikrishna Doppalapudi, Norcross, GA (US); Manickavasakam Karpagavinayagam, Norcross, GA (US); Igor Kulchytskyy, Norcross, GA (US); Gopinath Sekaran, Norcross, GA (US); Altaf Hussain, Norcross, GA (US); Manikandan Palaniappan, Norcross, GA (US); Shirley Heby Hubert, Norcross, GA (US)

(73) Assignee: AMERICAN MEGATRENDS INTERNATIONAL, LLC, Norcross, GA (US)

(*) Notice: Subject to any disclaimer, the term of this patent is extended or adjusted under 35 U.S.C. 154(b) by 1 day.

(21) Appl. No.: 16/749,156

(22) Filed: Jan. 22, 2020

(51) Int. Cl.
*G06F 3/06* (2006.01)
*G06F 11/30* (2006.01)

(52) U.S. Cl.
CPC .......... *G06F 3/0659* (2013.01); *G06F 3/0619* (2013.01); *G06F 3/0653* (2013.01); *G06F 3/0679* (2013.01); *G06F 11/3037* (2013.01)

(58) Field of Classification Search
CPC .......................... G06F 11/3037; G06F 3/0659
See application file for complete search history.

(56) References Cited

U.S. PATENT DOCUMENTS

| 10,599,504 B1* | 3/2020 | BeSerra | G06F 11/0727 |
| 2019/0332262 A1* | 10/2019 | Prasad | G06F 3/0604 |

OTHER PUBLICATIONS

Kranz, Garry, NVDIMM (Non-Volatile Dual In-Line Memory Module), https://searchstorage.techtarget.com/definition/NVDIMM-Non-Volatile-Dual-In-line-Memory-Module, Jan. 2017. (Year: 2017).*

* cited by examiner

*Primary Examiner* — Edward J Dudek, Jr.
(74) *Attorney, Agent, or Firm* — Newport IP, LLC; Leonard J. Hope

(57) ABSTRACT

Technologies are described herein for remotely configuring multi-mode dual in-line memory modules ("multi-mode DIMMs") using a firmware or a baseboard management controller ("BMC"). Technologies are also described for simultaneously initiating multiple commands for configuring multi-mode DIMMs using a BMC and for updating inventory data regarding multi-mode DIMMs stored by a BMC.

20 Claims, 9 Drawing Sheets

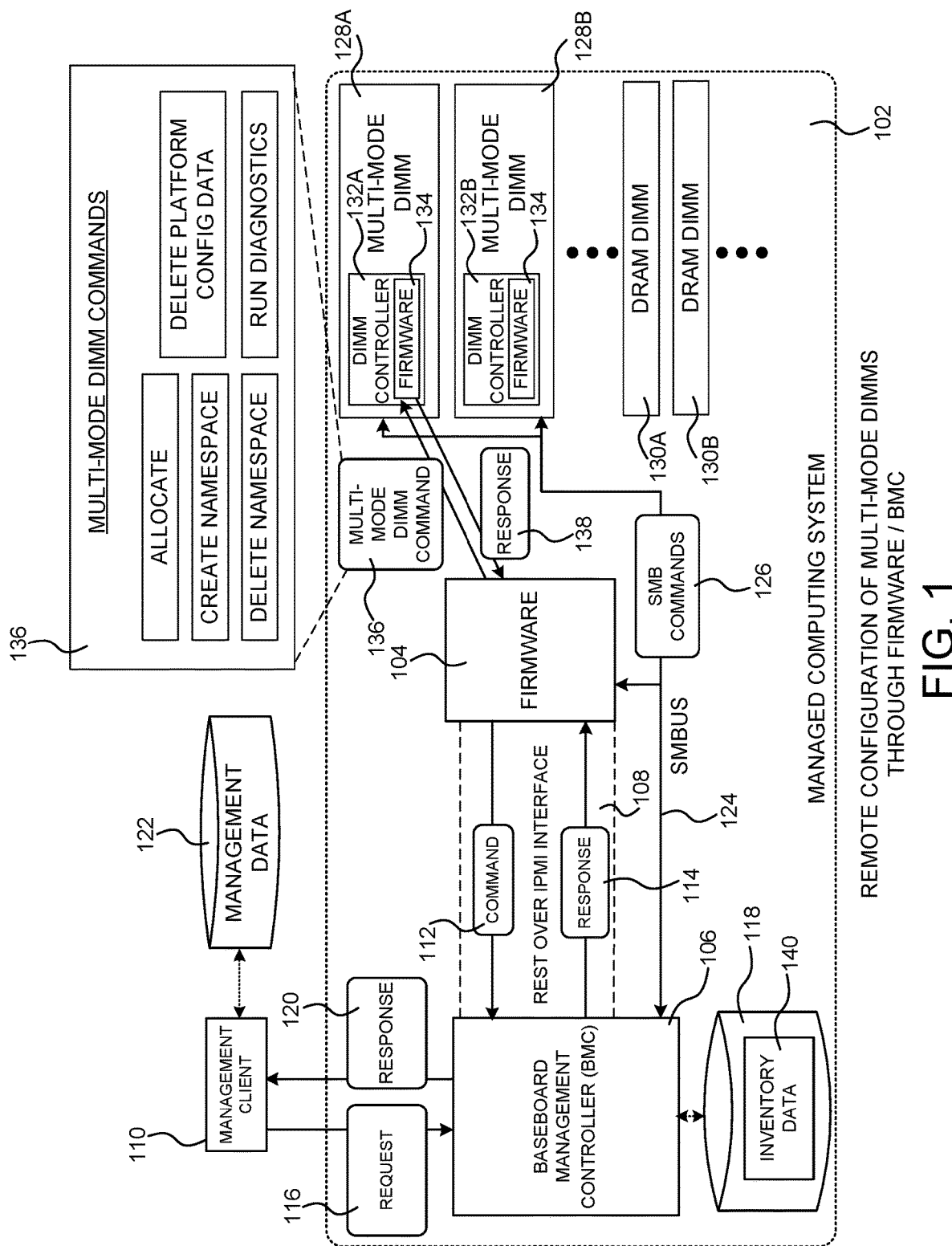

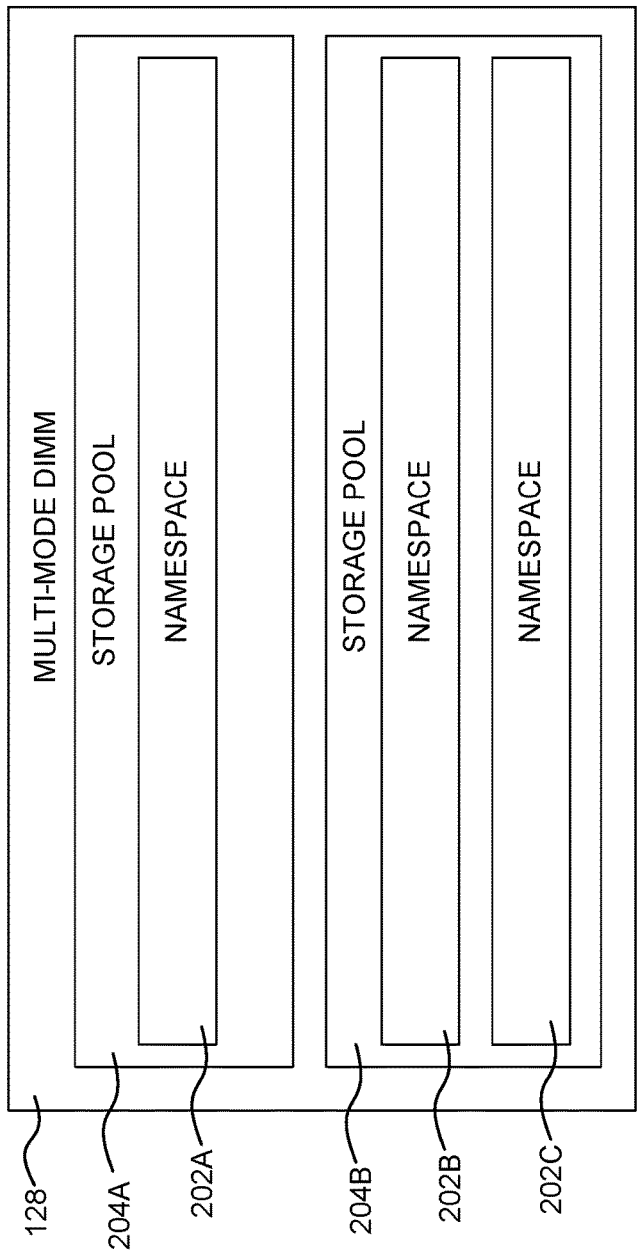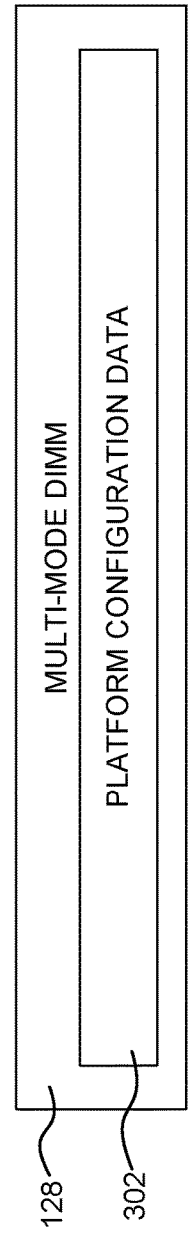

SIMULTANEOUS INITIATION OF MULTIPLE COMMANDS FOR CONFIGURING MULTI-MODE DIMMS USING A BMC

BACKGROUND

Multi-mode dual in-line memory modules ("DIMMs") are memory devices that support a volatile memory mode in which memory is volatile, a persistent memory mode in which memory is non-volatile, and a combination of both modes. Due to their complexity, multi-mode DIMMs can be complicated to configure. Consequently, multi-mode DIMMs can be configured improperly, which can result in computing systems that operate inefficiently or are that are not secure.

It is with respect to these and other considerations that the disclosure made herein is presented.

SUMMARY

Technologies are described herein for remotely configuring multi-mode DIMMs through firmware, remotely configuring multi-mode DIMMs through a baseboard management controller ("BMC") with and without the involvement of a firmware, simultaneously initiating multiple commands for configuring multi-mode DIMMs using a BMC, and for updating inventory, health, and security data from a BMC and a firmware. Through implementations of these technologies, various technical benefits can be achieved such as, but not limited to, efficient and accurate configuration of multi-mode DIMMs, reducing the number of system reboots required when configuring multi-mode DIMMs, efficient operation of computing systems implementing the disclosed technologies, and potentially others. Technical benefits other than those specifically mentioned herein can also be realized through an implementation of the disclosed technologies.

Remote Configuration of Multi-Mode DIMMs Through Firmware

One aspect of the technologies disclosed herein includes a mechanism for remote configuration of multi-mode DIMMs through a computing system firmware. In particular, a BMC can receive a request from a management client to perform a command on a multi-mode DIMM, or DIMMs, installed in a managed computing system. The request might be received, for example, by way of a uniform resource identifier ("URI") exposed by the BMC. As discussed briefly above, multi-mode DIMMs support a volatile memory mode in which memory is volatile, a persistent memory mode in which memory is non-volatile, and a mode in which some memory is volatile and other memory is non-volatile.

Responsive to receiving a request at the BMC, the BMC stores data identifying the command to be performed. On a reboot of the managed computing system, the firmware retrieves the data and, in response thereto, issues the command to the multi-mode DIMM, or DIMMs controllers. The commands can include, but are not limited to, a command for allocating the storage capacity of a multi-mode DIMM between volatile memory mode and persistent memory mode or both, a command to create a namespace associated with a multi-mode DIMM, a command to delete a namespace associated with a multi-mode DIMM, or DIMMs, a command to delete platform configuration data ("PCD") stored on a multi-mode DIMM, or DIMMs, and a command to perform a diagnostic operation on a multi-mode DIMM, or DIMMs. A command can also be provided to check the status of a previously-issued command. For certain commands, the firmware might initiate another reboot of the computing system following the issuance of the requested command to the multi-mode DIMM, or DIMMs.

Remote Configuration of Multi-Mode DIMMs Through a BMC

Another aspect of the technologies disclosed herein includes a mechanism for remote configuration of multi-mode DIMMs through a BMC. In particular, a BMC can receive a request from a management client to perform a command on a multi-mode DIMM, or DIMMs, installed in a managed computing system. As mentioned above, such a request can be received by way of a URI exposed by the BMC. For certain types of commands, the BMC can initiate the command through direct communication with a multi-mode DIMM, or DIMMs, without the involvement of the firmware 104. This can enable these commands to be executed without rebooting as would be required if the firmware were to initiate the commands.

In order to implement commands without the involvement of a firmware, a BMC can send system management bus ("SMBUS") commands to one or more multi-mode DIMMs via a SMBUS instructing the multi-mode DIMMs to perform a command. These commands can include, but are not limited to, a command to set a passphrase for a multi-mode DIMM, a command to disable a previously-set passphrase for a multi-mode DIMM, a command to set a master passphrase for a multi-mode DIMM, a command to securely erase the persistent data stored on a multi-mode DIMM, a command to "freeze" a multi-mode DIMM so that no actions can be performed on the DIMM until the next reboot, a command to unlock persistent memory on a multi-mode DIMM, a command to configure configurable settings on a multi-mode DIMM, and a command to cancel a command that was previously issued to a multi-mode DIMM. Details regarding each of these commands are provided below.

Simultaneous Initiation of Multiple Commands for Configuring Multi-Mode DIMMs Using a BMC The technologies disclosed herein also include a mechanism for simultaneously initiating multiple commands for configuring multi-mode DIMMs using a BMC. In particular, a BMC can receive a single request (which might be referred to herein as a "multi-command request") from a management client to perform multiple commands on one or more multi-mode DIMMs installed in a managed computing system. As in the examples above, such a request might be received by way of a URI exposed by the BMC. In this case, however, the multi-command request specifies parameters for use in performing multiple commands rather than for just a single command as in the examples above.

Responsive to receiving a multi-command request at the BMC, the BMC stores data identifying the commands to be performed. On a reboot of the managed computing system, the firmware retrieves the data and, in response thereto, issues the specified commands to the multi-mode DIMM, or DIMMs. A multi-command request can specify multiple create namespace commands, multiple delete namespace commands, or a create goal command and a create namespace command. A multi-command request might also indicate that a perform diagnostic command is also to be performed.

Updating Multi-Mode DIMM Inventory Maintained by a BMC

A mechanism for updating inventory data describing aspects of the configuration of multi-mode DIMMs that is maintained by a BMC is also disclosed. In particular, a BMC can expose a URI through which a firmware can provide updates to inventory data relating to multi-mode DIMMs following changes to the configuration of the DIMMs. Through the use of such a URI, a firmware can perform an HTTP POST operation containing the most up-to-date inventory data retrieved from the multi-mode DIMMs. The BMC can then store the updated inventory data in a data store for provision to a management client through various URIs.

The inventory data that is provided by the firmware can include, but is not limited to, identifiers for the multi-mode DIMMs, the health state of each DIMM, the manageability state of each DIMM, DIMM firmware version number, DIMM firmware API version number, DIMM security/lock state, DIMM manufacturer, DIMM serial number, DIMM part number, DIMM vendor ID, DIMM device ID, subsystem vendor ID, subsystem device ID, device locator, DIMM memory type, and DIMM operating speed. The inventory data 140 can also indicate whether first fast refresh is enabled, whether viral policy is enabled, the viral state of each DIMM 128, and identify the pool to which each DIMM 128 belongs.

The inventory data can also be configured to maintain data describing the current state of multi-mode DIMM storage pools. The inventory data relating to storage pools can include, but is not limited to, a pool ID, pool name, data describing the persistent memory type of a pool, the total pool capacity, the free capacity, and the health state of the pool. The inventory data relating to storage pools can also include links that include references to resources that are related to, but not contained by (subordinate to), a pool (e.g. DIMMs and/or a namespace).

The inventory data can also be configured to maintain data describing the current state of multi-mode DIMM namespaces. In this regard, the inventory data can include, but is not limited to, a unique identifier for each namespace, the name of each namespace, the size of each namespace, the label version for each namespace, the health state of each namespace, and a link to the pool in which a namespace is contained. Other inventory data relating to multi-mode DIMMs can be stored and updated in a similar fashion.

It should be appreciated that the above-described subject matter can also be implemented as a computer-controlled apparatus, a computer process, a computing system, or as an article of manufacture such as a computer-readable medium. These and various other features will be apparent from a reading of the following Detailed Description and a review of the associated drawings.

This Summary is provided to introduce a selection of the technologies disclosed herein in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 1 is a computing system diagram illustrating aspects of a mechanism for remotely configuring a multi-mode DIMM through a firmware, according to one or more embodiments presented herein;

FIG. 2 is a computing system diagram showing illustrative storage pools and namespaces stored on a multi-mode DIMM, in one example described herein;

FIG. 3 is a computing system diagram showing platform configuration data stored on a multi-mode DIMM, according to one embodiment disclosed herein;

DETAILED DESCRIPTION

Figure 4:
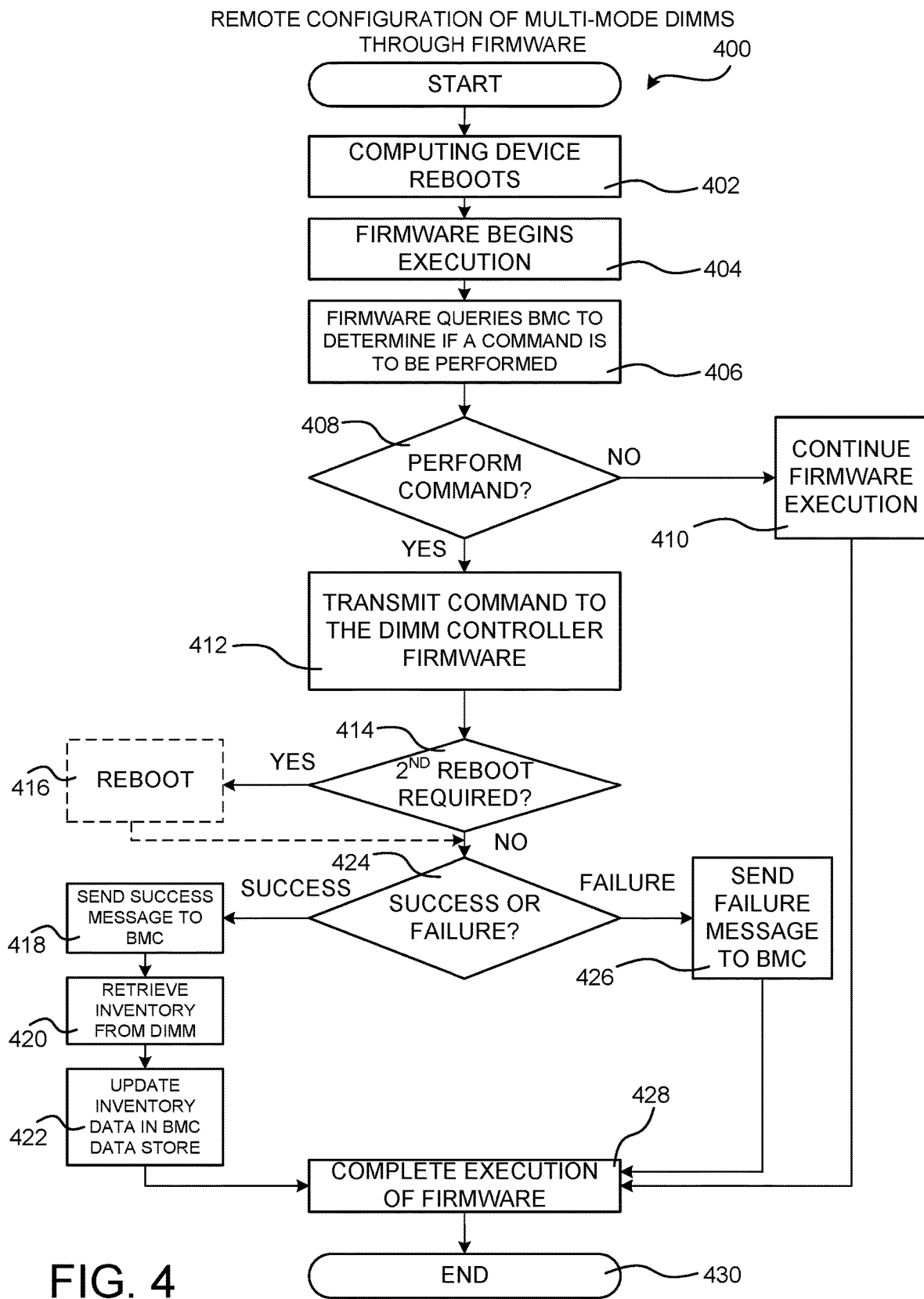
FIG. 4 is a flow diagram illustrating aspects of a routine for remotely configuring a multi-mode DIMM through a firmware, according to one or more embodiments presented herein.

The following detailed description is directed to technologies for remotely configuring multi-mode DIMMs through firmware, remotely configuring multi-mode DIMMs through a BMC without using a firmware, simultaneously initiating multiple commands for configuring multi-mode DIMMs using a BMC, and for updating inventory, health, and security data from a BMC and a firmware. As discussed briefly above, technical benefits such as efficient and accurate configuration of multi-mode DIMMs, reducing the number of system reboots required when configuring multi-mode DIMMs, and efficient operation of computing systems implementing the disclosed technologies might be realized through implementations of the disclosed technologies. Technical benefits other than those specifically mentioned herein can also be realized through an implementation of the disclosed technologies. Additional details regarding these aspects will be provided below with regard to FIGS. 1-10.

It is to be appreciated that the subject matter presented herein can be implemented as a computer process, a computer-controlled apparatus, a computing system, or an article of manufacture, such as a computer-readable storage medium. While the subject matter described herein is presented in the general context of program modules that execute on one or more computing devices, those skilled in the art will recognize that other implementations can be performed in combination with other types of program modules. Generally, program modules include routines, programs, components, data structures, and other types of structures that perform particular tasks or implement particular abstract data types.

Those skilled in the art will also appreciate that aspects of the subject matter described herein can be practiced on or in conjunction with other computer system configurations beyond those described herein, including multiprocessor systems, microprocessor-based or programmable consumer electronics, minicomputers, mainframe computers, hand-held computers, personal digital assistants, e-readers, mobile telephone devices, tablet computing devices, special-purposed hardware devices, network appliances, and the like. The configurations described herein can be practiced in distributed computing environments, where tasks can be performed by remote computing devices that are linked through a communications network. In a distributed computing environment, program modules can be located in both local and remote memory storage devices.

In the following detailed description, references are made to the accompanying drawings that form a part hereof, and that show, by way of illustration, specific configurations or examples. The drawings herein are not drawn to scale. Like numerals represent like elements throughout the several figures (which might be referred to herein as a "FIG." or "FIGS.").

Operating Environment

FIG. 1 is a computing system diagram illustrating aspects of an operating environment for the technologies disclosed herein. In particular, FIG. 1 illustrates aspects of a managed computing system 102 that is configured to implement aspects of the various technologies disclosed herein.

As illustrated in FIG. 1, the managed computing system 102 is equipped with a BMC 106. As discussed briefly above, a BMC 106 is a specialized service processor that monitors the physical state of a computer, such as the managed computing system 102, using sensors and communicates with a system administrator through an out-of-band network connected to a remote computing system referred to herein as a "management client 110."

In order to provide various aspects of its functionality, some of which are described herein, the BMC 106 also communicates with a firmware 104 executing on the managed computing system 102. The firmware 104 can be implemented to be compliant with the Unified Extensible Firm Interface ("UEFI") Specification. Other types of firmware can be utilized in other embodiments.

In one particular configuration, the BMC 106 communicates with the firmware 104 over a REST over IPMI interface 108. For example, and without limitation, the firmware 104 might generate a REST HTTP request (e.g. an HTTP POST request) that includes management data such as that described below. In embodiments disclosed herein, the REST HTTP request generated by the firmware 104 is compatible with the REDFISH management standard.

As discussed above, REDFISH is a successor to previous manageability interfaces created by the Desktop Management Task Force ("DMTF"). REDFISH is an open industry standard specification and schema for simple, modern, and secure management of scalable platform hardware, such as server computers located in data centers.

The REDFISH specification and schema specifies a REST interface, and utilizes JavaScript Object Notation ("JSON") and the Open Data Protocol ("OData") to integrate management solutions within existing toolchains. The management data in a firmware-generated REST HTTP request can also be expressed using JSON based on OData. Although the embodiments disclosed herein are described primarily as utilizing REDFISH, the REST HTTP requests and responses disclosed herein can be formatted according to other specifications in other embodiments.

In order to transmit a REST HTTP request to the BMC 106, the firmware 104 creates an OEM IPMI command 112 that encapsulates the REST HTTP request in one embodiment. The firmware 104, in turn, provides the OEM IPMI command 112 to the BMC 106 of the managed computing system 102. In response thereto, the BMC 106 can extract the REST HTTP request from the OEM IPMI command 112 and perform the processing required to satisfy the command 112.

The BMC 106 can then generate a REST HTTP response to the REST HTTP request received from the firmware 104 such as, for example, a response including data indicating that processing of the REST HTTP request was successful. The REST HTTP response is also compatible with the REDFISH management standard in embodiments disclosed herein. The BMC 106 also generates an OEM IPMI response 114 that encapsulates the REST HTTP response. The BMC 106 then provides the OEM IPMI response 114 that includes the REST HTTP response to the firmware 104.

The firmware 104 receives the OEM IPMI response 114 that includes the REST HTTP response from the BMC 106. The firmware 104 then extracts the REST HTTP response from the OEM IPMI response 114 received from the BMC 106. The firmware 104 then processes the REST HTTP response accordingly.

It is to be appreciated that the mechanism described above for enabling REST communication between the firmware 104 and the BMC 106 is merely illustrative and that other mechanisms can be utilized. Additional details regarding the mechanism described above can be found in U.S. patent application Ser. No. 15/893,503, entitled "REST OVER IPMI INTERFACE FOR FIRMWARE TO BMC COMMUNICATION," which was filed on Feb. 9, 2018, and which is expressly incorporated herein by reference in its entirety.

The BMC 106 can also expose a REDFISH-compatible interface (not shown in FIG. 1) through which management clients 110 can perform various types of functionality, some of which are described below. For example, the management client 110 might generate an HTTP request 116 to retrieve management data 122 from the BMC 106. The management data 122 can include, but is not limited to, data describing aspects of the operating state of the managed computing system 102. Communication between the BMC 106 and the management client 110 can be provided over an out-of-band network connection (not shown in FIG. 1) between the BMC 106 and the management client 110.

In response to receiving a request 116, the BMC 106 can retrieve the requested management data 122 from a data store 118 and provide an HTTP response 120 to the management client 110 that includes the requested management data 122. As will be described in greater detail below, the management data 122 can include inventory data 140 that describes aspects of the configuration and operation of multi-mode DIMMs 128 (described below) installed in the managed computing device 102.

As shown in FIG. 1, the BMC 106 can also communicate with the firmware 104 through a System Management Bus ("SMBUS") 124. The SMBUS 124 is typically implemented as a two-wire interface through which components within the managed computing system 102 can communicate with rest of the system. Using the SMBUS 124, for example, the BMC 106 can issue SMB commands 126 to the firmware 104, some of which are described below.

It is to be appreciated that the operating environment shown in FIG. 1 and described above has been simplified for discussion purposes, and that many other software and hardware components can be utilized to implement the functionality disclosed herein. For example, and without limitation, various networks and networking components can be utilized to connect the management client 110 to the BMC 106. In this regard, it is also to be appreciated that while only a single managed computing system 102 and a single management client 110 have been illustrated in FIG. 1, many such computing systems can be utilized in various configurations.

Remote Configuration of Multi-Mode DIMMs Through Firmware

FIG. 1 also shows aspects of one mechanism disclosed herein for remotely configuring multi-mode DIMMs through a firmware 104. As will be described in greater detail below, the mechanism illustrated in FIG. 1 utilizes a firmware 104 to configure aspects of the operation of multi-mode DIMMs 128A and 128B (which might be referred to individually as a multi-mode DIMM 128 or collectively as the multi-mode DIMMs 128).

The multi-mode DIMMs 128 are memory devices that are capable of being configured as non-volatile memory ("persistent memory mode"), volatile memory ("volatile memory mode"), or both non-volatile and volatile memory simultaneously. In one configuration, the multi-mode DIMMs 128 are non-volatile DIMMs ("NVDIMMs"). Other multi-mode DIMMs using other technologies or from other manufacturers can also be utilized. The managed computing system 102 can also include conventional memory devices such as the dynamic random-access memory ("DRAM") DIMMs 130A and 130B.

As illustrated in FIG. 1, the multi-mode DIMMs 128A and 128B include controllers 132A and 132B, respectively, that control aspects of the operation of the multi-mode DIMMS 128. Each controller 132 includes a firmware 134 that performs various types of functionality including, but not limited to, receiving commands 136 from the firmware 104, executing the commands 136, and providing a response 138 to the commands 136 to the firmware 104. For instance, the firmware 134 might provide a response 138 indicating whether a command 136 was successfully executed or whether the command 136 failed.

The commands 136 can include, but are not limited to: a command to allocate capacity of a multi-mode DIMM 128 between volatile memory and persistent memory; a command to create a namespace associated with a multi-mode DIMM 128; a command to delete a namespace associated with a multi-mode DIMM 128; a command to delete platform configuration data ("PCD") stored on a multi-mode DIMM 128; and a command to perform a diagnostic operation on a multi-mode DIMM 128. The performance of each of these commands will be described in greater detail below. Other types of commands 136 can be performed using the technologies disclosed herein in other embodiments.

In order for the firmware 104 and the multi-mode DIMMS 128 to execute commands 136, it may be necessary for the managed computing system 102 to be rebooted multiple times. For example, and without limitation, the management client 110 might transmit a request 116 to the BMC 106 to perform a command 136. In response thereto, the BMC 106 stores data in the data store 118 indicating that the requested command 136 is to be performed. The management client 110 can also request that the managed computing system 102 be rebooted.

Following the reboot of the managed computing system 102, the firmware 104 is executed. The firmware 104 then utilizes the REST over IPMI interface 108 described above to transmit a REST HTTP request to the BMC 106 for data identifying the requested command 136 and any associated parameters. As discussed above, the REST HTTP request can be formatted according to the REDFISH standard. In turn, the BMC 106 returns a REST HTTP response with data identifying the command 136 to be performed.

When the firmware 104 receives a response from the BMC 106, the firmware 104 transmits the requested command 136 to the firmware 134 executing on the DIMM controller 132 of the multi-mode DIMM, or DIMMs, upon which the requested command 136 is to be performed. The multi-mode DIMM, or DIMMs, then performs the requested command 136 and provides a response 138 to the firmware 104 indicating whether the command 136 failed or was successful. The firmware 104, in turn, generates a REST HTTP command to the BMC 106 indicating the success or failure of the command 136. The BMC 106 can then provide a response 120 to the management client 110 indicating the success or failure of the command 136. The BMC 106 can also update the inventory data 140 based upon the result of the execution of the command 136.

Some of the commands 136 described briefly above (e.g. allocate and delete PCD, described below) require multiple reboots of the managed computing system 102. For these commands, the firmware 104 causes the managed computing system 102 to reboot following the successful performance of the requested command 136 by a multi-mode DIMM 128. Prior to rebooting the managed computing system 102 for the second time, the firmware 104 transmits a REST HTTP message to the BMC 106 indicating that the requested operation is in progress. Following the reboot, the firmware 104 can provide another REST HTTP message to the BMC 106 indicating the failure or success of the requested command 136. The BMC 106 can then update the inventory data 140 accordingly.

In order to perform the commands 136 described herein, the firmware 104 can obtain the inventory data 140 for the multi-mode DIMMs 128 at boot time. As used herein, the term "boot time" refers to the time period after the firmware 104 begins executing and before the operating system of the managed computing system 102 starts to load.

The firmware 104 can utilize the inventory data 140 to validate commands 136 to be performed. For example, if the BMC 106 requests performance of a command 136 to delete a namespace (described below), the firmware 104 will determine, based on the inventory data 140, whether the namespace exists. If the namespace does not exist, the firmware 104 will transmit a REST HTTP response to the BMC 106 indicating that the requested command 136 cannot be performed. In this example, the firmware 104 will not transmit the requested command 136 to the multi-mode DIMMs 128.

Details regarding the performance of commands 136 on multi-mode DIMMS 128 using the firmware 104 will now be described. As discussed briefly above, the commands 136 can include a command (which might be referred to herein as an "allocate command" or a "create goal command") to allocate capacity of a multi-mode DIMM 128 between volatile memory and persistent memory. An allocate command creates a memory allocation goal (which might also be referred to herein as a "pool" or "storage pool") on one or more multi-mode DIMMs 128. A storage pool 204, shown in FIG. 2, refers to a specific allocation of memory between volatile memory and persistent memory. Multiple pools 204A and 204B can be created on a single multi-mode DIMM 128. Pools can also span multiple multi-mode DIMMs 128.

In order to execute the allocate command, the firmware 104 stores data on the target multi-mode DIMMs 128 that can be used during the next reboot of the managed computing system 102 to map the capacity of the multi-mode DIMMs 128 into system memory address space. Once this operation has completed, the firmware 104 updates data describing the status of the command on the BMC 106 to indicate that the command is in-progress. The managed computing system 102 is then rebooted and the status of the command can be updated as completed.

As discussed above, the firmware 104 might validate the allocate command prior to execution. For example, the firmware 104 might ensure that the allocation of memory does not exceed the available memory. If so, the firmware 104 can provide a response to the BMC 106 indicating that the allocate command could not be performed. Following completion of the allocate command, the firmware 104 can also update the inventory data 140 to reflect the allocation.

In order to enable utilization of the allocate command, the BMC 106 can expose a REDFISH-compatible HTTP URI to the management client 110 corresponding to the allocate command. The URI might be formatted, for example, as: https://{{IP Address}}//redfish/v1/Systems/Self/Actions/OEM/OEMName/NVDIMM. CreateGoal. Other URI formats can be utilized in other configurations. Calls to this URI from the management system 110 will include OEM-defined parameters for the allocate command such as, for instance, parameters describing the allocation of memory between volatile memory and persistent memory.

The commands 136 can also include commands to create a namespace 202, shown in FIG. 2, that is associated with a multi-mode DIMM 128 and a command to delete a namespace 202 associated with a multi-mode DIMM 128. Creation of a namespace 202 for a multi-mode DIMM 128 creates a file system on the DIMM 128 so that an operating system executing on the managed computing system 102 can utilize storage capacity of the device.

A create namespace command can specify a pool of space on one or more of the multi-mode DIMMs 128 for which the namespace 202 is to be created. The command can also specify the amount of a pool 204 that is to be utilized for the namespace 202. In the example shown in FIG. 2, for instance, a namespace 202A has been created in the storage pool 204A and the namespaces 202B and 202C have been created in the storage pool 204B.

For a create namespace command to be performed, the target multi-mode DIMMs 128 must be unlocked, the specified pool 204 must have already been created, and the health state of the DIMM 128 and pool 204 must be healthy. If any of these conditions are not met, the firmware 104 will instruct the BMC 106 that the command cannot be performed.

As in the example above, the BMC 106 can expose an HTTP URI to the management client 110 corresponding to the create namespace command. The URI might be formatted, for example, as: https://{{IP Address}}//redfish/v1/Systems/Self/Memory/OEM/OEMName/NVDIMM/Pools/{{pool instance}}/Actions/NVDIMM.CreateNamespace. Other URI formats can be utilized in other configurations. Calls to this URI from the management system 110 will include OEM-defined parameters for the create namespace command such as, for instance, the identity of the pool for which the namespace is to be created, the namespace name, mode, and capacity of the namespace.

A delete namespace command can be utilized to delete a namespace 202 created in the manner described above. For a delete namespace command to be performed, the namespace 202 to be deleted must currently exist. If the namespace 202 to be deleted does not exist, the firmware 104 will instruct the BMC 106 that the command could not be performed.

The BMC 106 can expose an HTTP URI to the management client 110 corresponding to the delete namespace command. The URI might be formatted, for example, as: https://{{IP Address}}//redfish/v1/Systems/Self/Memory/OEM/OEMName/NVDIMM/Namespaces/{{Namespace_instance}}/Actions/NVDIMM.DeleteNamespace. Other URI formats can be utilized in other configurations. Calls to this URI from the management system 110 will include an OEM-defined parameter specifying the name of the namespace 202 to be deleted.

The commands 136 can also include a command to delete PCD 302, shown in FIG. 3, that is stored on a multi-mode DIMM 128. As mentioned briefly above, the PCD 302 is data describing the configuration of the multi-mode DIMM 128. For example, and without limitation, the PCD 302 can include data defining the associated storage pools 204, namespaces 202, security settings for a multi-mode DIMM 128. Prerequisites for performance of the delete PCT command are that the target multi-mode DIMM 128 is unlocked and not disabled.

As in the examples above, the BMC 106 can expose an HTTP URI to the management client 110 corresponding to the delete PCD command. The URI might be formatted, for example, as: https://{{IP Address}}//redfish/v1/Systems/Self/Memory/{{Memory instance}}/Actions/NVDIMM.Delete.PlatformConfigurationData. Other URI formats can be utilized in other configurations. Calls to this URI from the management system 110 will include an OEM-defined parameter identifying the multi-mode DIMM 128 for which the PCD is to be deleted. Additionally, a URI can be exposed for globally deleting the PCD 302 associated with multiple multi-mode DIMMs 128. An illustrative format for this URI is: https://{{IP Address}}//redfish/v1/Systems/Self/Memory/OEM/OEMName/NVDIMM.DeletePlatformConfigurationData. Calls to this URI will result in the global deletion of PCT 302 associated with the multi-mode DIMMs 128.

The commands 136 can also include a command to perform a diagnostic test on a multi-mode DIMM 128. As in the examples above, the BMC 106 can expose an HTTP URI to the management client 110 corresponding to the perform diagnostic command. The URI might be formatted, for example, as: https://{{IP Address}}//redfish/v1/Systems/Self/Memory/{{instance}}/Actions/Oem/OEM Name/NVDIMM.RunDiagnostics. Other URI formats can be utilized in other configurations.

Data indicating whether the specified diagnostic passed or failed will be returned in response to a call to this URI. Additionally, a URI can be exposed for simultaneously initiating diagnostics on all of the multi-mode DIMMs 128 in a computing system. An illustrative format for this URI is: https://{{IP Address}}//redfish/v1/Systems/Self/Memory/OEM/OEMName/NVDIMM.RunDiagnostics.

Calls to the perform diagnostic URI from the management system 110 will include an OEM-defined parameter specifying the name of the diagnostic, or diagnostics, to be performed and the multi-mode DIMM 128, or DIMMs, upon which the diagnostic is to be performed. The diagnostics can include, but are not limited to, a "quick" diagnostic that tests basic health indicators, a "config" diagnostic that verifies that the data maintained by the firmware 105 describing the inventory of a multi-mode DIMM 128 matches the installed hardware, a "security" diagnostic to verify that all multi-mode DIMMs 128 in a system have a consistent security state, and a "firmware" diagnostic that verifies that all installed multi-mode DIMMs 128 of a given model have a consistent firmware 134 installed and that modifiable firmware parameters are set in accordance with best practices.

A status command can also be provided which, when called, provides the status of the last executed command. For instance, an indication might be returned indicating whether the last command is in progress, was successful, or failed. An example URI for this command is: http:{{IP Address}}//redfish/v1/OEM/OEM Name/ActionStatus. Additional details regarding the execution of the commands 136 will be provided below with respect to FIG. 4.

FIG. 4 is a flow diagram showing a routine 400 that illustrates aspects of the operation of the managed computing system 102 shown in FIG. 1 for remotely configuring multi-mode DIMMs 128 through a firmware 104, according to one embodiment presented herein. It is to be appreciated that the logical operations described herein with respect to FIG. 4, and the other FIGS., can be implemented (1) as a sequence of computer implemented acts or program modules running on a computing system and/or (2) as interconnected machine logic circuits or circuit modules within the computing system.

The implementation of the various components described herein is a matter of choice dependent on the performance and other requirements of the computing system. Accordingly, the logical operations described herein are referred to variously as operations, structural devices, acts, or modules. These operations, structural devices, acts, and modules can be implemented in software, in firmware, in special purpose digital logic, and any combination thereof. It should also be appreciated that more or fewer operations might be performed than shown in the FIGS. and described herein. These operations can also be performed in parallel, or in a different order than those described herein. These operations can also be performed by components other than those specifically identified.

The routine 400 begins at operation 402, where the managed computing device 102 reboots. As discussed above, in order for the firmware 104 and the multi-mode DIMMS 128 to execute commands 136, it may be necessary for the managed computing system 102 to be rebooted multiple times. For example, and without limitation, the management client 110 might transmit a request 116 to the BMC 106 to perform a command 136. In response thereto, the BMC 106 stores data in the data store 118 indicating that the requested command 136 is to be performed. The management client 110 can also request that the managed computing system 102 be rebooted.

Following the reboot of the managed computing system 102 at operation 402, the firmware 104 begins execution at operation 404. The routine 400 then proceeds to operation 406, where the firmware 104 then utilizes the REST over IPMI interface 108 described above to transmit a REST HTTP request to the BMC 106 for data identifying the requested command 136 and any associated parameters. As discussed above, the REST HTTP request can be formatted according to the REDFISH standard. In turn, the BMC 106 returns a REST HTTP response with data identifying the command 136 to be performed.

When the firmware 104 receives a response from the BMC 106, the firmware 104 determines if a command 136 is to be performed. If not, the routine 400 proceeds to operation 410, where the firmware 104 continues is execution in a conventional manner. The routine 400 then proceeds from operation 410 to operation 430, where the firmware 104 completes its execution and hands control of the managed computing system 102 off to an operating system.

If a command 136 is to be performed, the routine 400 proceeds from operation 408 to operation 412. At operation 412, the firmware 104 transmits the requested command 136 to the firmware 134 executing on the DIMM controller 132 of the multi-mode DIMM, or DIMMs, upon which the requested command 136 is to be performed. The multi-mode DIMM, or DIMMs, then performs the requested command 136 and provides a response 138 to the firmware 104 indicating whether the command 136 failed or was successful.

As mentioned above, some commands 136 require a second reboot of the managed computing device 102. For these commands, the routine 400 proceeds from operation 414 to operation 416, where the firmware 104 initiates a reboot of the managed computing system 102. The routine 400 then proceeds to operation 424, described below.

If a second reboot of the managed computing system 102 is not required, the routine 400 proceeds from operation 414 to operation 425. At operation 425, the firmware 104 determines if the execution of the command succeeded or failed. If execution of the command failed, the routine 400 proceeds from operation 424 to operation 426, where the firmware 104 transmits a failure message to the BMC 106 in the manner described above.

If the command was executed successfully, the routine 424 proceeds from operation 424 to operation 418, where the firmware 104 generates a REST HTTP command to the BMC 106 indicating that the command 136 was successful. As discussed above, the BMC 106 updates the inventory data 140 based upon the result of the execution of the command 136.

From operation 418, the routine 400 proceeds to operation 420, where the firmware 104 retrieves inventory data for the multi-mode DIMMs 128. This data represents the actual current state of the multi-mode DIMMs 128 following execution of the command. The routine 400 then proceeds from operation 420 to operation 422, where the firmware 104 provides the inventory data to the BMC 106 for storage in the data store 118. In this way, the inventory data 140 in the data store 118 is guaranteed to reflect the actual current state of the multi-mode DIMMs 128.

From operation 422, the routine 400 proceeds to operation 428, where the firmware 104 completes its execution and hands off control of the managed computing device 102 to an operating system. The routine 400 then proceeds from operation 428 to operation 430, where it ends.

Remote Configuration of Multi-Mode DIMMs Through a BMC

FIG. 1 also illustrates aspects of one mechanism disclosed herein for remotely configuring multi-mode DIMMs 128 using a BMC 106. In particular, and as discussed briefly above, the BMC 106 can initiate certain commands 136 without the involvement of the firmware 104, which can enable the commands 136 to be executed without rebooting the system 102 as would be required if the firmware 104 were to initiate the commands 136 in the manner described above. In order to enable this functionality, the BMC 106 sends SMB commands 126 to one or more multi-mode DIMMs 128 via the SMBUS 124 instructing the multi-mode DIMMs 128 to perform a command 136. Additional details regarding this process and the commands 136 that can be directly initiated by the BMC 106 are described below.

As in the example described above, the BMC 106 can perform various types of error and security state checks when a request 116 is received from a management client 110 to perform an operation on a multi-mode DIMM 128. For example, and without limitation, the BMC 106 might validate the request to determine if the request has been submitted by a valid user, determine if the DIMM number specified in the request corresponds to an installed multi-mode DIMM 128, determine if the current security state (e.g. disabled, enabled, locked, password enabled, etc.) of the DIMM 128 enables performance of the command, modify the security state of the DIMM 128 (e.g. unlock the DIMM 128) to perform the requested command if possible, or validate the parameters set forth in the request 116.

If the validation process described above is successful, the BMC 106 can perform the requested command. The BMC 106 can also update the inventory data 140 to indicate the command is in progress when the command is started and update the inventory data 140 again once the command has completed successfully.

Several types of commands that the BMC 106 can perform on the multi-mode DIMMS 128 will now be described. For example, the BMC 106 can issue a command to a multi-mode DIMM 128 to set a passphrase utilized to secure the DIMM 128. In order to enable this functionality, the BMC 106 can expose an HTTP URI to the management client 110 corresponding to the set passphrase command. The URI might be formatted, for example, as: https://{{ip}}//redfish/v1/Systems/Self/Memory/{{Mem_instance}}/Oem/Ami/NVDIMM.SetPassphrase. Other URI formats can be utilized in other configurations. Calls to this URI from the management system 110 will include a new passphrase, a confirmation of the new passphrase, and the current passphrase for the multi-mode DIMM 128. Additionally, a URI can be exposed for globally setting a passphrase for all of the multi-mode DIMMs 128 in a system. An illustrative format for this URI is: https://{{ip}}//redfish/v1/Systems/Self/Actions/Oem/Ami/NVDIMM.SetPassphrase.

The BMC 106 can also issue a command to a multi-mode DIMM 128 to disable a previously-set passphrase for the multi-mode DIMM 128. In order to enable this functionality, the BMC 106 can expose an HTTP URI to the management client 110 corresponding to the disable passphrase command. The URI might be formatted, for example, as: https://{{ip}}//redfish/v1/Systems/Self/Memory/{{Mem_instance}}/Oem/Ami/NVDIMM.DisablePassphrase. Other URI formats can be utilized in other configurations. Calls to this URI from the management system 110 will include the existing passphrase for the multi-mode DIMM 128. Additionally, a URI can be exposed for globally disabling a previously-set passphrase for all of the multi-mode DIMMs 128 in a system. An illustrative format for this URI is: https://{{ip}}//redfish/v1/Systems/Self/Actions/Oem/Ami/NVDIMM.DisablePassphrase.

The BMC 106 can also issue a command to a multi-mode DIMM 128 to set a master passphrase for use in recovering the multi-mode DIMM 128. In order to enable this functionality, the BMC 106 can expose an HTTP URI to the management client 110 corresponding to the set master passphrase command. The URI might be formatted, for example, as: https://{{ip}}//redfish/v1/Systems/Self/Memory/{{Mem_instance}}/Oem/Ami/NVDIMM.SetMasterPassword. Other URI formats can be utilized in other configurations. Calls to this URI from the management system 110 will include a new master passphrase, a confirmation of the new master passphrase, and the current passphrase for the multi-mode DIMM 128. Additionally, a URI can be exposed for globally setting a master passphrase for all of the multi-mode DIMMs 128 in a system. An illustrative format for this URI is: https://{{ip}}//redfish/v1/Systems/Self/Actions/Oem/Ami/NVDIMM.SetMasterPassword.

The BMC 106 can also issue a command to a multi-mode DIMM 128 to securely erase the persistent data on the multi-mode DIMM 128. In order to enable this functionality, the BMC 106 can expose an HTTP URI to the management client 110 corresponding to the secure erase command. The URI might be formatted, for example, as: https://{{ip}}//redfish/v1/Systems/Self/Memory/{{Mem_instance}}/Oem/Ami/NVDIMM.SecureErase. Other URI formats can be utilized in other configurations. Calls to this URI from the management system 110 will include the existing passphrase for the DIMM 128. Additionally, a URI can be exposed for globally erasing the persistent data stored on a DIMM 128. An illustrative format for this URI is: https://{{ip}}//redfish/v1/Systems/Self/Memory/{{Mem_instance}}/Oem/Ami/NVDIMM.SecureErase. Calls to this URI will result in the global erasure of the persistent data stored on the multi-mode DIMMs 128 in a system.

The BMC 106 can issue a command (commonly referred to as a "freeze lock" command) to a multi-mode DIMM 128 to lock state changes to the DIMM 128 until the next reboot. If the security state for a DIMM 128, or DIMMs 128, is set to "frozen," then no other BMC actions are permitted until after the next reboot. In order to enable this functionality, the BMC 106 can expose an HTTP URI to the management client 110 corresponding to the freeze lock command. The URI might be formatted, for example, as: https://{{ip}}//redfish/v1/Systems/Self/Memory/{{Mem_instance}}/Oem/Ami/NVDIMM.FreezeLock. Other URI formats can be utilized in other configurations. Calls to this URI from the management system 110 do not include any parameters. Additionally, a URI can be exposed for globally freezing multi-mode DIMMs 128. An illustrative format for this URI is: https://{{ip}}//redfish/v1/Systems/Self/Actions/Oem/Ami/NVDIMM.FreezeLock. Calls to this URI will result in the global locking of state changes for all of the multi-mode DIMMs 128 in a system until the next reboot.

The BMC 106 can issue a command to a multi-mode DIMM 128 to unlock the persistent memory on a locked multi-mode DIMM 128. In order to enable this functionality, the BMC 106 can expose an HTTP URI to the management client 110 corresponding to the unlock command. The URI might be formatted, for example, as: https://{{ip}}//redfish/v1/Systems/Self/memory/{{Mem_instance}}/Oem/Ami/NVDIMM.UnlockUnit. Other URI formats can be utilized in other configurations. Calls to this URI from the management system 110 will include the current passphrase for the DIMM 128. Additionally, a URI can be exposed for globally unlocking DIMMs 128. An illustrative format for this URI is: https://{{ip}}//redfish/v1/Systems/Self/Actions/Oem/Ami/NVDIMM.UnlockUnit. Calls to this URI will result in the global unlocking of locked multi-mode DIMMs 128 in a system.

The BMC 106 can also issue a command to a multi-mode DIMM 128 to configure configurable settings (which might be referred to as a "a data policy") used by the DIMM 128. In order to enable this functionality, the BMC 106 can expose an HTTP URI to the management client 110 corresponding to the configure data policy command. The URI might be formatted, for example, as: https://{{ip}}//redfish/v1/Systems/Self/Memory/{{Mem_instance}}/Oem/Ami/NVDIMM.ConfigureDataPolicy. Other URI formats can be utilized in other configurations. Calls to this URI from the management system 110 can include values for configurable settings for a DIMM 128 such as, but not limited, a Boolean value indicating whether acceleration of a first refresh cycle for a DIMM 128 is enabled. Additionally, a URI can be exposed for globally configuring settings for DIMMs 128. An illustrative format for this URI is: https://{{ip}}//redfish/v1/Systems/Self/Actions/Oem/Ami/NVDIMM.ConfigureDataPolicy. Calls to this URI will result in the configuration of the specified setting, or settings, on all of the multi-mode DIMMs 128 in a system.

The BMC 106 can issue a command to a multi-mode DIMM 128 to cancel a previously-issued command to the DIMM 128. In order to enable this functionality, the BMC 106 can expose an HTTP URI to the management client 110 corresponding to the cancel action command. The URI might be formatted, for example, as: https://{{ip}}//redfish/v1/Systems/Self/Actions/Oem/Ami/NVDIMM.CancelAction. Other URI formats can be utilized in other configurations. Calls to this URI will result in the cancellation of a specified action that has been previously issued to a DIMM 128, or DIMMs 128, but that has not yet completed.

Figure 5:
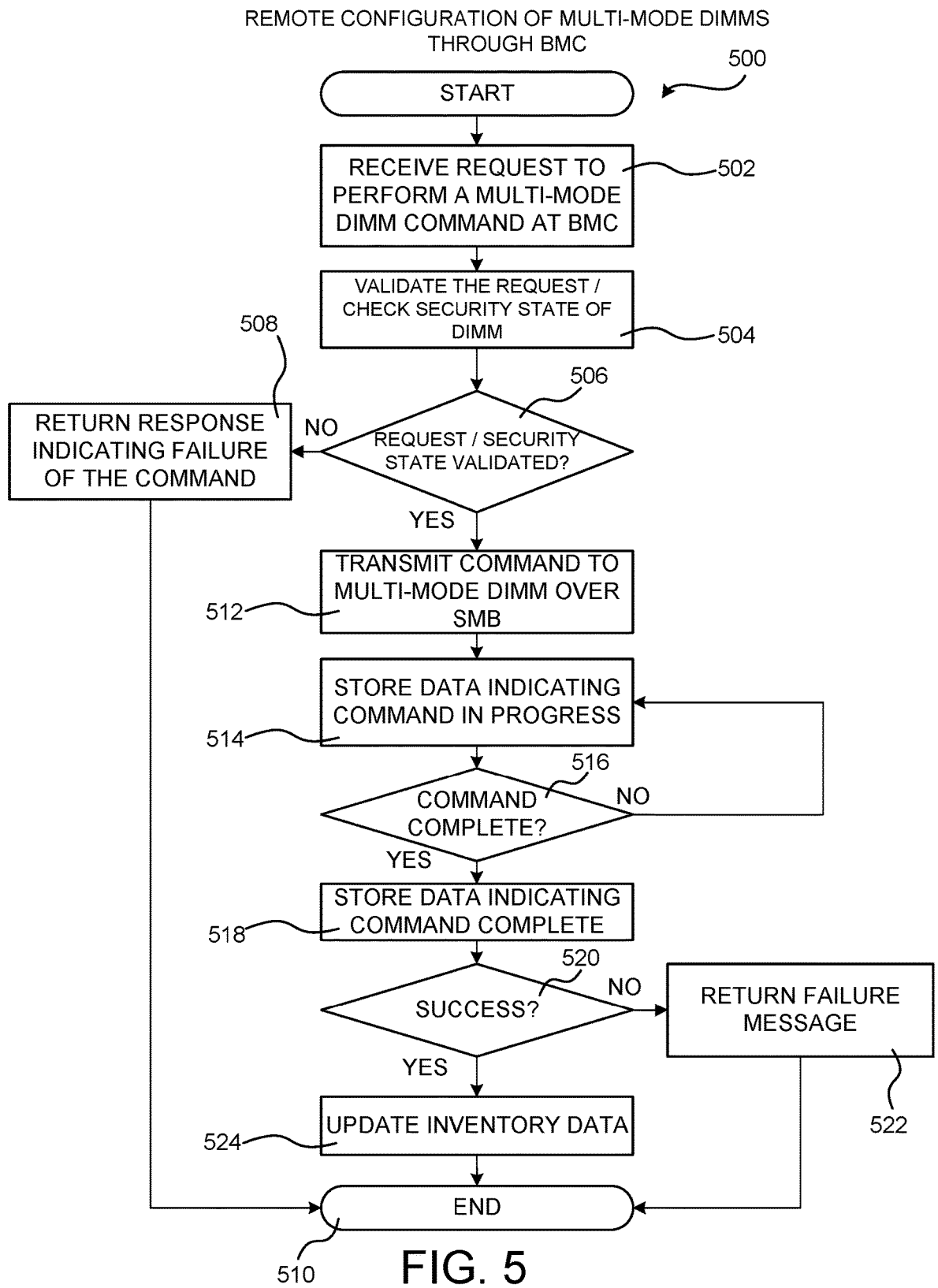
FIG. 5 is a flow diagram illustrating aspects of a routine for remotely configuring a multi-mode DIMM through a BMC without the use of a firmware, according to one or more embodiments presented herein.

FIG. 5 is a flow diagram showing a routine 500 that illustrates aspects of the operation of the computing system 102 for remotely configuring multi-mode DIMMs 128 through a BMC 106 without using a firmware 104, according to one embodiment presented herein. The routine 500 begins at operation 502, where the BMC 106 receives a request 116 to perform a command on a multi-mode DIMM 128, or DIMMs 128. As discussed above, such a request 116 can be received by the BMC 106 from a management client 110. Commands can include, but are not limited to, a command to set a passphrase for a multi-mode DIMM, a command to disable a previously-set passphrase for a multi-mode DIMM, a command to set a master passphrase for a multi-mode DIMM, a command to securely erase the persistent data stored on a multi-mode DIMM, a command to "freeze" a multi-mode DIMM so that no actions can be performed on the DIMM until the next reboot, a command to unlock persistent memory on a multi-mode DIMM, a command to configure configurable settings on a multi-mode DIMM, and a command to cancel a command that was previously issued to a multi-mode DIMM.

From operation 502, the routine 500 proceeds to operation 504, where the BMC 106 can perform various types of error and security state checks when a request 116 is received from a management client 110 to perform an operation on a multi-mode DIMM 128. For example, and without limitation, the BMC 106 might validate the request to determine if the request has been submitted by a valid user, determine if the DIMM number specified in the request corresponds to an installed multi-mode DIMM 128, determine if the current security state (e.g. disabled, enabled, locked, password enabled, etc.) of the DIMM 128 enables performance of the command, modify the security state of the DIMM 128 (e.g. unlock the DIMM 128) to perform the requested command if possible, or validate the parameters set forth in the request 116.

If the validation process described above is not successful, the routine 500 proceeds from operation 506 to operation 508, where the BMC 106 can return a response 120 to the request 116 indicating that the requested command could not be performed. The routine 500 then proceeds from operation 508 to operation 510, where it ends.

If the request 116 is successfully validated, the routine 500 proceeds from operation 506 to operation 512, where the BMC 106 transmits an SMBUS command 126 to a multi-mode DIMM 128, or DIMMs 128, over the SMBUS 124. The SMBUS command 126 instructs the multi-mode DIMM 128, or DIMMs 128, to perform the command identified in the request 116.

From operation 512, the routine 500 proceeds to operation 514, where the BMC 106 can store data in the data store 118 indicating that the command issued at operation 512 is in progress. If a new command is received while another command is in progress, the new command will be blocked.

From operation 512, the routine 500 proceeds to operation 514, where the BMC 106 determines if the command issued to the multi-mode DIMM 128, or DIMMs 128, at operation 512 has completed. If the command has completed, the routine 500 proceeds from operation 516 to operation 518, where the BMC 106 updates the data stored in the data store 118 to indicate that the command has completed. The routine 500 then proceeds from operation 518 to operation 520.

At operation 520, the BMC 106 receives a response to the SMB command 126 from the multi-mode DIMM 128, or DIMMs 128, and determines if the command completed successfully. If the command did not complete successfully, the BMC 106 returns a response 120 to the request 116 indicating that the command failed. The routine 500 then proceeds from operation 522 to operation 510, where it ends.

If the command 126 completed successfully, the routine 500 proceeds from operation 520 to operation 524, where the BMC 106 can update the inventory data 140 stored in the data store 118 to reflect the change to the configuration of the DIMM 128 or DIMMs 128. The routine 500 then proceeds from operation 524 to operation 510, where it ends.

Figure 6:
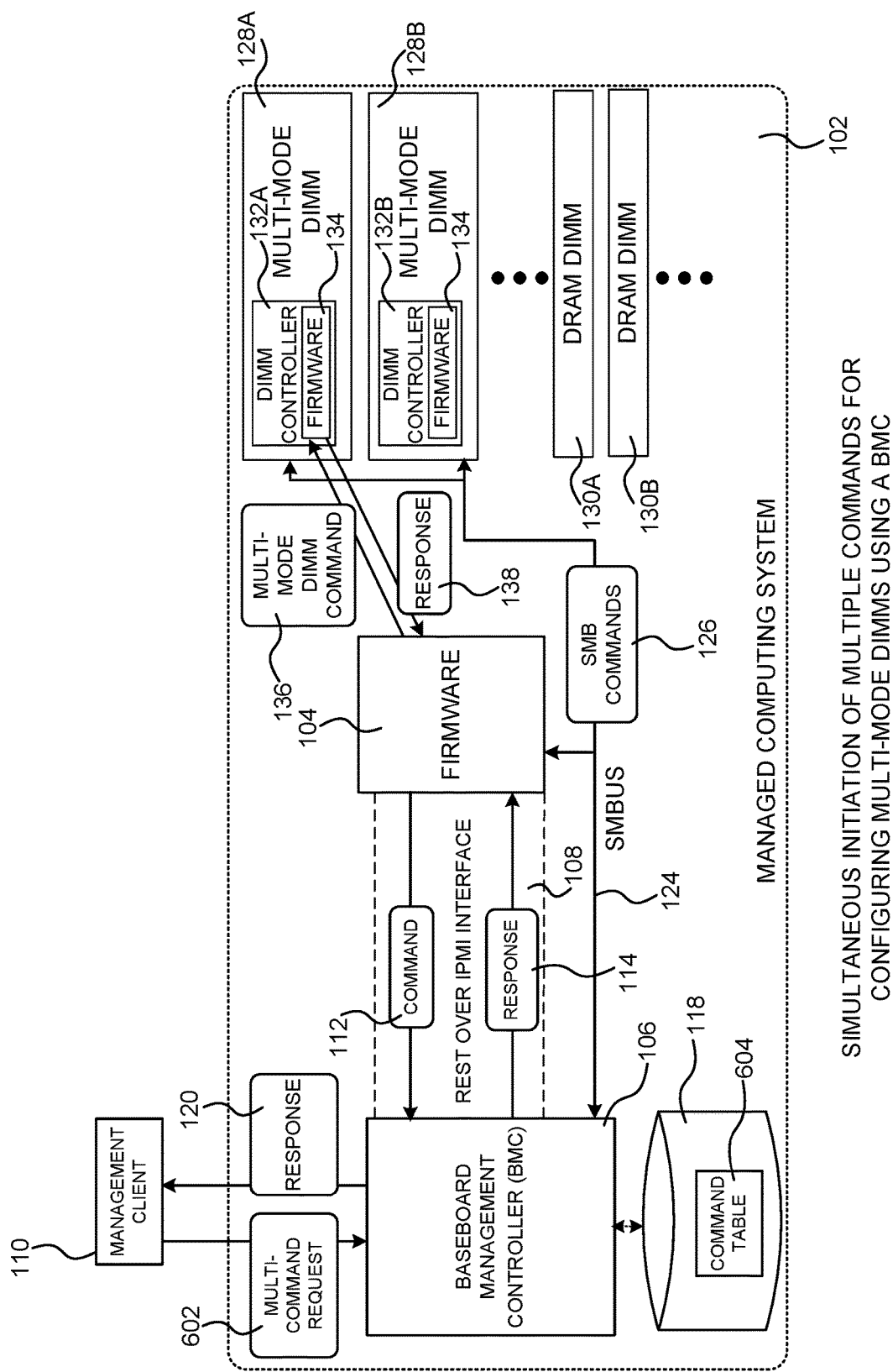
FIG. 6 is a computing system diagram illustrating aspects of a mechanism for simultaneously initiating multiple commands for configuring multi-mode DIMMs using a BMC, according to one or more embodiments presented herein.

Simultaneous Initiation of Multiple Commands for Configuring Multi-Mode DIMMs Using a BMC Turning now to FIG. 6, aspects of the technologies disclosed herein for simultaneously initiating multiple commands for configuring multi-mode DIMMs 128 using a BMC 106 will be described. As shown in FIG. 6, BMC 106 can receive a single request 602 (which might be referred to herein as a "multi-command request 602") from a management client 110 to perform multiple commands on one or more multi-mode DIMMs 128 installed in a managed computing system 102. As in the examples above, a multi-command request 602 might be received by way of a URI exposed by the BMC 106. In this case, however, the multi-command request 602 specifies parameters for use in performing multiple commands rather than for just a single command as in the examples above.

Responsive to receiving a multi-command request 602 at the BMC 16, the BMC 106 stores data identifying the commands to be performed in a command table 604 located in the data store 118. On a reboot of the managed computing system 102, the firmware 104 retrieves the data from the command table 604 in the manner described above and, in response thereto, issues the specified commands 136 to the multi-mode DIMM, or DIMMs 128. As a described briefly above, a multi-command request 602 can specify multiple create namespace commands, multiple delete namespace commands, or a create goal command and a create namespace command. Details regarding these particular multi-command requests 602 are provided below.

As discussed above, a multi-command request 602 can specify that multiple create namespace commands are to be performed. In order to enable this functionality, the BMC 106 can expose an HTTP URI to the management client 110 corresponding to a multi-command request 602 for performing multiple create namespace commands. The URI might be formatted, for example, as: https://{{ip}}/redfish/v1/Systems/Self/Actions/Oem/Ami/NVDIMM.CreateMultipleNamespaces. Other URI formats can be utilized in other configurations. The management system 110 can perform an HTTP POST to this URI with the properties of the multiple namespaces to be created. The properties can include, but are not limited to, the names of the namespaces to be created, the namespace mode to be used (e.g. none or sector) for each namespace, a region identifier for each namespace, and the capacity of each namespace to be created. The BMC 106 can store these properties in a command table 604 stored in the data store 118. The firmware 104 can obtain these parameters from the BMC 106 by performing an HTTP GET to the BMC 106 using this URI. As discussed above, the HTTP GET can be encapsulated in an OEM IPMI command 112 in the manner described above.

A multi-command request 602 can also specify that multiple delete namespace commands are to be performed. In order to enable this functionality, the BMC 106 can expose an HTTP URI to the management client 110 corresponding to a multi-command request 602 for performing multiple delete namespace commands. The URI might be formatted, for example, as: https://{{ip}}/redfish/v1/Systems/Self/Actions/Oem/Ami/NVDIMM.DeleteMultipleNamespaces. Other URI formats can be utilized in other configurations. The management system 110 can perform an HTTP POST to this URI with the properties of the multiple namespaces to be deleted. The properties can include, but are not limited to, identifiers for the namespaces to be deleted. The BMC 106 can store these properties in a command table 604 stored in the data store 118. The firmware 104 can obtain these parameters from the BMC 106 by performing an HTTP GET to the BMC 106 using this URI. As discussed above, the HTTP GET can be encapsulated in an OEM IPMI command 112 in the manner described above.

A multi-command request 602 can also specify that an allocate command and a create namespace command are to be performed. In order to enable this functionality, the BMC 106 can expose an HTTP URI to the management client 110 corresponding to a multi-command request 602 for performing the allocate and create namespace commands. The URI might be formatted, for example, as: https://{{ip}}/redfish/v1/Systems/Self/Actions/Oem/Ami/NVDIMM.CreateGoalNamespaces. Other URI formats can be utilized in other configurations.

The management system 110 can perform an HTTP POST to the URI above with the properties of the allocate and create namespace commands to be performed. The properties can include, but are not limited to, the configuration level to be used (e.g. platform or socket), the memory mode, persistent memory type (e.g. app direct or app direct not interleaved), the namespace mode to be used (e.g. none or sector) for each namespace, a user-specified namespace name, and a socket identifier that identifies an available memory socket. As in the examples above, the BMC 106 can store these properties in a command table 604 stored in the data store 118. The firmware 104 can obtain these parameters from the BMC 106 by performing an HTTP GET to the BMC 106 using this URI. As discussed above, the HTTP GET can be encapsulated in an OEM IPMI command 112 in the manner described above.

In some embodiments, a multi-command request 602 can also specify that a diagnostic command also be performed in addition to any other specified commands. For instance, a multi-command request 602 can specify that multiple create namespace commands and a diagnostic command are to be performed, that multiple delete namespace commands and a diagnostic command are to be performed, or that a create goal command, a create namespace command, and a diagnostic command are to be performed.

In some embodiments, the BMC 106 also exposes a URI through which the firmware 104 or the management client 110 can obtain the status of the command that was most recently issued to the multi-mode DIMMs 128. In one embodiment, this URI is formatted as: http://{{ip}}//redfish/v1/Oem/Ami/NVDIMM/ActionStatus. The firmware 104 or the management client 110 can perform an HTTP GET to this URI to obtain the status information. The status information might indicate, for instance, that a command has been issued.

Figure 7:
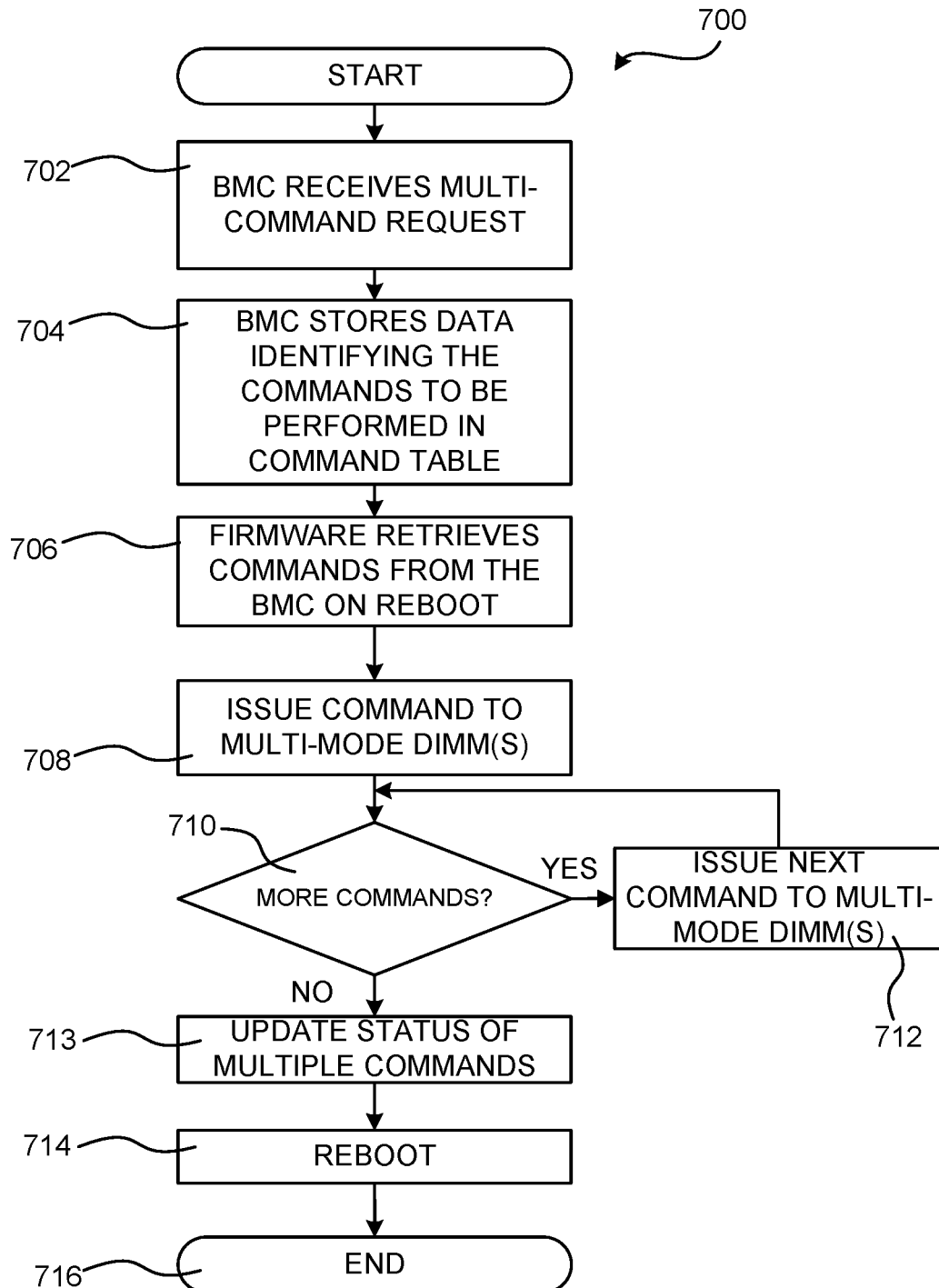
FIG. 7 is a flow diagram illustrating aspects of a routine for simultaneously initiating multiple commands for configuring multi-mode DIMMs using a BMC, according to one or more embodiments presented herein.

FIG. 7 is a flow diagram illustrating aspects of a routine 700 for simultaneously initiating multiple commands for configuring multi-mode DIMMs 128 using a BMC 106, according to one or more embodiments presented herein. The routine 700 begins at operation 702, where the BMC 106 receives a multi-command request 602 such as those described above with respect to FIG. 6. In response to receiving a multi-command request 602, the routine 700 proceeds from operation 702 to operation 704, where the BMC 106 stores data identifying the commands to be performed in the command table 604 in the data store 118. As discussed above, the various parameters provided in the call to the URI for performing a multi-command request 602 can be stored in the command table 604.

From operation 704, the routine 700 proceeds to operation 706, where the firmware 104 retrieves the commands from the BMC 106 on the next reboot. In particular, the firmware 104 can call a URI exposed by the BMC 106, such as those described above, to retrieve the commands and their associated parameters. In turn, the routine 700 proceeds from operation 706 to operation 708, where the firmware 104 issues the appropriate multi-mode DIMM commands 136 to the firmware 134 of the specified multi-mode DIMM 128, or DIMMs 128. A reboot may be performed following the issuance of some types of commands 136.

The routine 700 proceeds from operation 708 to operation 710, where the firmware 134 determines if additional commands 136 remain to be issued to the DIMMs 128. If additional commands 136 remain to be issued, the routine 700 proceeds from operation 710 to operation 712, where the next command 136 is issued. If no additional commands 136 remain to be issued, the routine 700 proceeds from operation 710 to operation 713, where the firmware 104 provides data to the BMC 106 regarding the status of the multiple commands issued to the DIMMs 128. From operation 713, the routine 700 proceeds to operation 714, where the system 102 may be rebooted. The routine 700 then proceeds from operation 714 to operation 716, where it ends.

Updating Multi-Mode DIMM Inventory Data Maintained by a BMC

Following modification to the configuration of the multi-mode DIMMs 128 using any of the commands described above, the inventory data 140 maintained by the BMC 106 must be updated in order to ensure that the BMC 106 has access to information describing the actual configuration of the multi-mode DIMMs 128. In order to enable the firmware 104 to update the inventory data 140 following an operation that modifies the configuration of a DIMM 128, the BMC 106 exposes a URI for updating the inventory data 140 in some embodiments. Through the use of this URI, the firmware 104 can perform an HTTP POST operation containing the most up-to-date inventory data 140 retrieved from the multi-mode DIMMs 128. The BMC 106 can then store the updated inventory data 140 in the data store 118 for provision to the management client 110 and for other uses. The firmware 104 can also issue PATCH calls to update the data and issue DELETE calls to delete the data.

The inventory data 140 that is provided by the firmware 104 can include, but is not limited to, identifiers for the DIMMs 128, the health state of each DIMM (e.g. healthy, non-critical failure, critical failure, fatal failure, unmanageable, non-functional, or unknown), the manageability state of each DIMM (e.g. manageable or unmanageable), DIMM firmware version number, DIMM firmware API version number, DIMM security/lock state (e.g. unknown, disabled, unlocked, locked, frozen, password, max limit, unsupported), DIMM manufacturer, DIMM serial number, DIMM part number, DIMM vendor ID, DIMM device ID, subsystem vendor ID, subsystem device ID, device locator, DIMM memory type, and DIMM operating speed.

The inventory data 140 can also indicate whether first fast refresh is enabled, whether viral policy is enabled, the viral state of each DIMM 128, and identify the storage pool to which each DIMM 128 belongs. The inventory data 140 might also include other data not specifically described herein. An example HTTP POST request generated by the firmware 104 for use in updating the inventory data 140 is shown in Table 1.

TABLE 1

```
"Oem": {
    "Ami": {
        "NVDIMM": {
            "DimmUid": "8089-A2-1749-00000DB6",
            "DimmId": "0x0003",
            "DimmPhysicalId": "0x303E",
            "Manageability State": 0,
            "HealthState": "Healthy",
            "FirstFastRefresh": true,
            "ViralPolicyEnable": false,
            "Viral State": false,
            "Pool":                                  {"@odata.id":
"/redfish/v1/Systems/Self/Memory/Oem/NVDIMM/Pools/456"
        }
      }
    }
}
```

The inventory data 140 can also be configured to maintain data describing the current state of multi-mode DIMM storage pools. As discussed above, a storage pool 204 is a specific allocation of memory between volatile memory and persistent memory. As also discussed above, multiple pools 204A and 204B can be created on a single multi-mode DIMM 128 and pools can span multiple multi-mode DIMMs 128.

The inventory data 140 relating to storage pools can include, but is not limited to, a pool ID, pool name, data describing the persistent memory type (e.g. AppDirect, AppDirectNotInterleaved, Storage, or Mixed) of a pool, the total pool capacity, the free capacity, and the health state of the pool (e.g. normal, error, unknown, pending, or locked). The inventory data 140 relating to storage pools can also include links that include references to resources that are related to, but not contained by (subordinate to), a pool (e.g. DIMMs 128 and/or a namespace). An example HTTP POST request generated by the firmware 104 for use in updating the inventory data 140 with storage pool-related information is shown in Table 2.

TABLE 2

```
{
    "Id": "123",
    "Name": "123 NVDIMM Pool",
    "PersistentMemoryType": "AppDirect",
    "CapacityMiB": 982000,
    "FreeCapacityMiB": 0,
    "HealthState": "Locked",
    "Links": {
        "Dimms": [
            {
                "@odata.id": "/redfish/v1/Systems/Self/Memory/1"
            },
            {
                "@odata.id": "redfish/v1/Systems/Self/Memory/2"
            }
        ],
        "Namespace": {
            "@odata.id":
"/redfish/v1/Systems/Self/Memory/Oem/Ami/NVDIMM/Namespaces/123"
        }
    }
}
```

In a similar fashion, the inventory data 140 can also be configured to maintain data describing the current state of multi-mode DIMM namespaces. In this regard, the inventory data 140 can include, but is not limited to, a unique identifier for each namespace, the name of each namespace, the size of each namespace, the label version for each namespace, and the health state of each namespace (e.g. unknown, okay, warning, critical, unsupported, or locked).

As discussed briefly above, the BMC 106 can expose various interfaces through which callers, such as the management client 110, can obtain the inventory data 140. For example, and without limitation, the BMC 106 can expose interfaces for providing inventory data 140 regarding memory collections, DIMMs 128, namespaces, storage pools, and smart health information.

Figure 8:
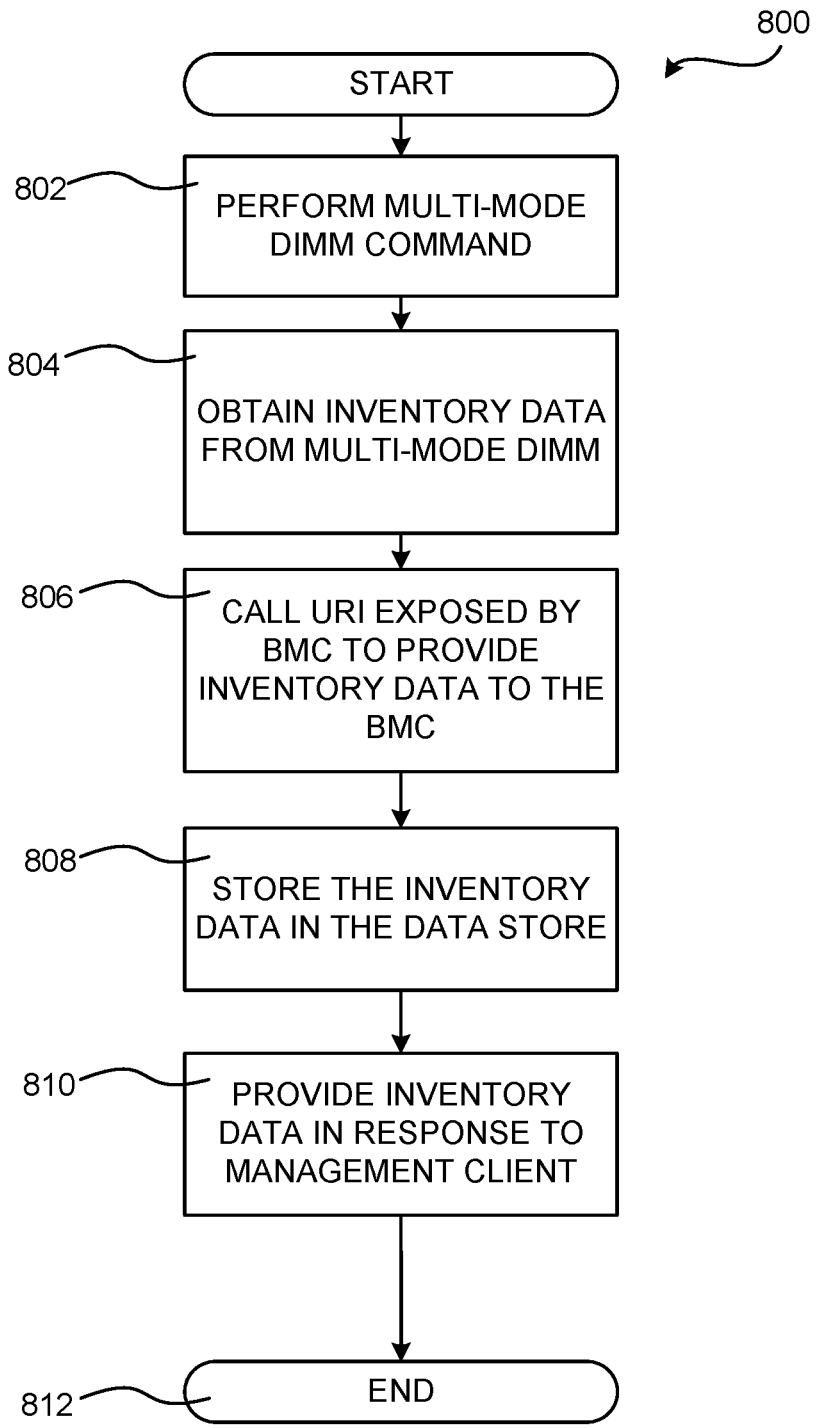
FIG. 8 is a flow diagram illustrating aspects of a routine for updating multi-mode DIMM inventory data maintained by a BMC, according to one or more embodiments presented herein.

FIG. 8 is a flow diagram illustrating aspects of a routine 800 for updating multi-mode DIMM inventory data 140 maintained by a BMC 106, according to one or more embodiments presented herein. The routine 800 begins at operation 802, where the firmware 104 performs a multi-mode DIMM command 136 in the manner described above. For example, and without limitation, the firmware 104 might perform an allocate command, a create namespace command, a delete namespace command, or a delete PCD command, as described above.

From operation 802, the routine 800 proceeds to operation 804, where the firmware 104 obtains inventory data 140 such as that described above from the multi-mode DIMMs 128 immediately after the performance of the command at operation 802. The routine 800 then proceeds from operation 804 to operation 806, where the firmware 104 performs an HTTP POST to a URI exposed by the BMC 106 in order to provide the collected inventory data 140 to the BMC 106.

From operation 806, the routine 800 proceeds to operation 808, where the BMC 106 processes the call to the URI from the firmware 104 and updates the inventory data 140 stored in the data store 118 with the data received from the firmware 106. The routine 800 then proceeds from operation 808 to operation 810, where the BMC 106 can expose URIs for providing the inventory data 140 stored in the data store 118 to other callers such as, for example, the management client 110. The routine 800 then proceeds from operation 810 to operation 812, where it ends.

Figure 9:
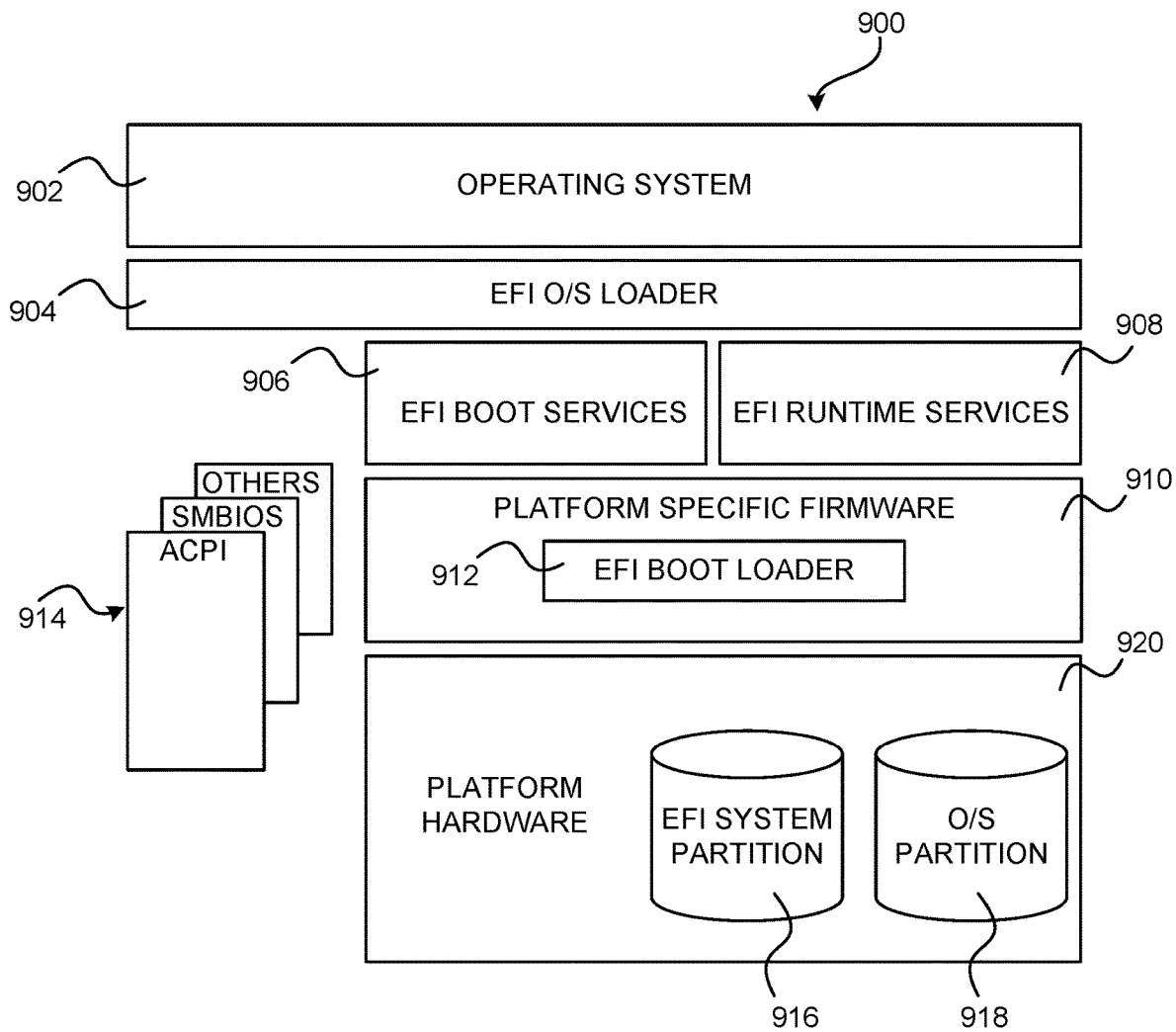
FIG. 9 is a software architecture diagram illustrating a software architecture for a unified extensible firmware interface ("UEFI")-compliant firmware that provides an operating environment for aspects of the technologies presented herein in one embodiment.

Turning now to FIG. 9, a software architecture diagram will be described that illustrates an architecture for a Unified Extensible Firmware Interface ("UEFI") Specification-compliant firmware 900 that can be configured to provide and/or utilize aspects of the technologies disclosed herein. In particular, the firmware architecture shown in FIG. 9 can be utilized to implement the firmware 104 described above. The firmware 104 can also be implemented in other ways in other configurations.

The UEFI Specification describes an interface between an operating system 902 and a UEFI Specification-compliant firmware 900. The UEFI Specification also defines an interface that a firmware 900 can implement, and an interface that an operating system 902 (which might be referred to herein as an "OS") can use while booting. How a firmware implements the interface can be left up to the manufacturer of the firmware. The UEFI Specification also defines a way for an operating system 902 and a firmware 900 to exchange information necessary to support the operating system boot process. The term "UEFI Specification" used herein refers to both the EFI Specification developed by INTEL CORPORATION and the UEFI Specification managed by the UEFI FORUM.

As shown in FIG. 9, the architecture can include platform hardware 920, such as that described below with regard to FIG. 10, and an operating system 902. A boot loader 912 for the operating system 902 can be retrieved from the UEFI system partition 916 using a UEFI operating system loader 904. The UEFI system partition 916 can be an architecturally shareable system partition. As such, the UEFI system partition 916 can define a partition and file system designed to support safe sharing of mass storage between multiple vendors. An OS partition 918 can also be utilized.

Once started, the UEFI OS loader 904 can continue to boot the complete operating system 902. In doing so, the UEFI OS loader 904 can use UEFI boot services 906, an interface to other supported specifications to survey, comprehend, and initialize the various platform components and the operating system software that manages them. Thus, interfaces 914 from other specifications can also be present on the system. For example, the ACPI and the System Management BIOS ("SMBIOS") specifications can be supported.

UEFI boot services 906 can provide interfaces for devices and system functionality used during boot time. UEFI runtime services 908 can also be available to the UEFI OS loader 904 during the boot phase. UEFI allows extension of platform firmware by loading UEFI driver and UEFI application images which, when loaded, have access to UEFI-defined runtime and boot services.

Additional details regarding the operation and architecture of a UEFI Specification-compliant firmware can be found in the UEFI Specification which is available from the UEFI Forum. INTEL CORPORATION has also provided further details regarding recommended implementation of EFI and UEFI in the form of The INTEL Platform Innovation Framework for EFI ("the Framework"). Unlike the UEFI Specification, which focuses on programmatic interfaces for the interactions between the operating system 902 and system firmware 900, the Framework is a group of specifications that together describe a firmware implementation that has been designed to perform the full range of operations that are required to initialize a platform from power on through transfer of control to the operating system 902. The specifications that make up the Framework, which are also available from INTEL CORPORATION, are also expressly incorporated herein by reference.

Figure 10:
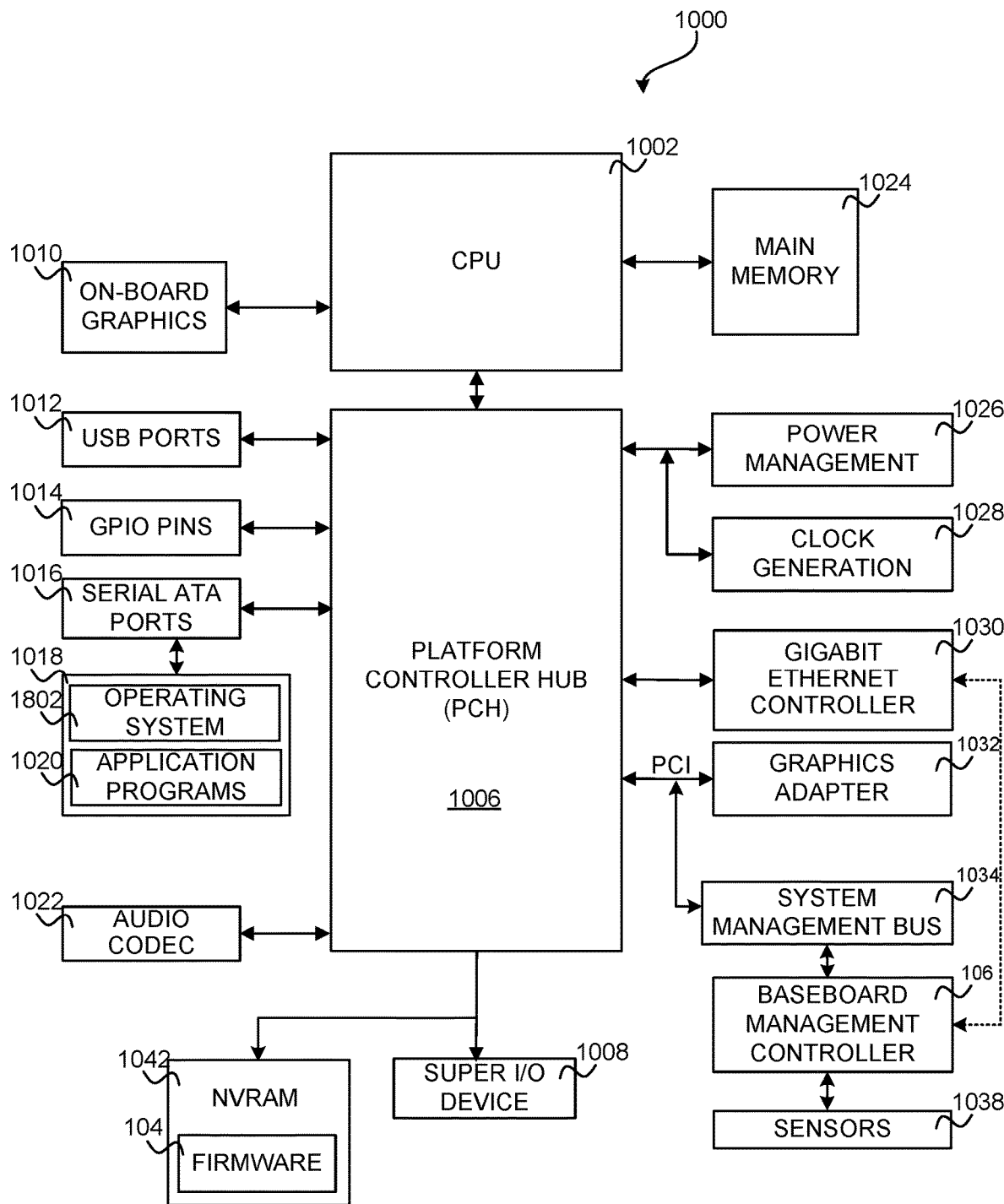
FIG. 10 is a computer architecture diagram that shows an illustrative architecture for a computer that can implement the technologies disclosed herein.

Referring now to FIG. 10, a computer architecture diagram that shows an illustrative architecture for a computer that can provide an operating environment for the technologies presented herein will be described. For example, and without limitation, the computer architecture shown in FIG. 10 can be utilized to implement the managed computing system 102 and/or any of the other computing systems disclosed herein.

FIG. 10 and the following discussion are intended to provide a brief, general description of a suitable computing environment in which the configurations described herein can be implemented. While the technical details are presented herein in the general context of program modules that execute in conjunction with the execution of an operating system, those skilled in the art will recognize that the configurations can also be implemented in combination with other program modules.

Generally, program modules include routines, programs, components, data structures, and other types of structures that perform particular tasks or implement particular abstract data types. Moreover, those skilled in the art will appreciate that the configurations described herein can be practiced with other computer system configurations, including handheld devices, multiprocessor systems, microprocessor-based or programmable consumer electronics, minicomputers, mainframe computers, and the like. The configurations described herein can also be practiced in distributed computing environments where tasks are performed by remote processing devices that are linked through a communications network. In a distributed computing environment, program modules can be located in both local and remote memory storage devices.

In particular, FIG. 10 shows an illustrative computer architecture for a computer 1000 that can be utilized in the implementations described herein. The illustrative computer architecture shown in FIG. 10 is for the computer 1000, and includes a baseboard, or "motherboard", which is a printed circuit board to which a multitude of components or devices can be connected by way of a system bus or other electrical communication path. In one illustrative configuration, a central processing unit ("CPU") 1002 operates in conjunction with a Platform Controller Hub ("PCH") 1006. The CPU 1002 is a central processor that performs arithmetic and logical operations necessary for the operation of the computer 1000. The computer 1000 can include a multitude of CPUs 1002. Each CPU 1002 might include multiple processing cores.

The CPU 1002 provides an interface to a random access memory ("RAM") used as the main memory 1024 in the computer 1000 and, possibly, to an on-board graphics adapter 1010. The PCH 1006 provides an interface between the CPU 1002 and the remainder of the computer 1000.

The PCH 606 can also be responsible for controlling many of the input/output functions of the computer 1000. In particular, the PCH 1006 can provide one or more universal serial bus ("USB") ports 1012, an audio codec 1022, a Gigabit Ethernet Controller 1032, and one or more general purpose input/output ("GPIO") pins 1014. The USB ports 1012 can include USB 2.0 ports, USB 3.0 ports and USB 3.1 ports among other USB ports. The audio codec 1022 can include Intel High Definition Audio, Audio Codec '97 ("AC '97") and Dolby TrueHD among others.

The PCH 1006 can also include functionality for providing networking functionality through a Gigabit Ethernet Controller 1030. The Gigabit Ethernet Controller 1030 is capable of connecting the computer 1000 to another computer via a network. Connections which can be made by the Gigabit Ethernet Controller 1030 can include LAN or WAN connections. LAN and WAN networking environments are commonplace in offices, enterprise-wide computer networks, intranets, and the Internet.

The PCH 1006 can also provide a bus for interfacing peripheral card devices such as a graphics adapter 1032. In one configuration, the bus comprises a PCI bus. The PCI bus can include a Peripheral Component Interconnect ("PCI") bus, a Peripheral Component Interconnect eXtended ("PCI-X") bus and a Peripheral Component Interconnect Express ("PCIe") bus among others.

The PCH 1006 can also provide a system management bus 1034 for use in managing the various components of the computer 1000. Additional details regarding the operation of the system management bus 1034 and its connected components are provided below. Power management circuitry 1026 and clock generation circuitry 1028 can also be utilized during the operation of the PCH 1006.

The PCH 1006 is also configured to provide one or more interfaces for connecting mass storage devices to the computer 1000. For instance, according to one configuration, the PCH 1006 includes a serial advanced technology attachment ("SATA") adapter for providing one or more serial ATA ports 1016. The serial ATA ports 1016 can be connected to one or more mass storage devices storing an OS, such as OS 902 and application programs 1020, such as a SATA disk drive 1018. As known to those skilled in the art, an OS 1802 comprises a set of programs that control operations of a computer and allocation of resources. An application program is software that runs on top of the operating system 1802, or other runtime environment, and uses computer resources to perform application specific tasks desired by the user.

According to one configuration, the OS 1802 comprises the LINUX operating system. According to another configuration, the OS 1802 comprises the WINDOWS operating system from MICROSOFT CORPORATION. According to another configuration, the OS 1802 comprises the UNIX operating system or one of its variants. It should be appreciated that other operating systems can also be utilized.

The mass storage devices connected to the PCH 1006, and their associated computer-readable storage media, provide non-volatile storage for the computer 1000. Although the description of computer-readable storage media contained herein refers to a mass storage device, such as a hard disk or CD-ROM drive, it should be appreciated by those skilled in the art that computer-readable storage media can be any available media that can be accessed by the computer 1000.

By way of example, and not limitation, computer-readable storage media can comprise computer storage media and communication media. Computer storage media includes volatile and non-volatile, removable and non-removable media implemented in any method or technology for storage of information such as computer-readable instructions, data structures, program modules or other data. However, computer-readable storage media does not encompass transitory signals. Computer storage media includes, but is not limited to, RAM, ROM, EPROM, EEPROM, flash memory or other solid state memory technology, CD-ROM, DVD, HD-DVD, BLU-RAY, or other optical storage, magnetic cassettes, magnetic tape, magnetic disk storage or other magnetic storage devices, or any other medium which can be used to store the desired information, and which can be accessed by the computer 1000.

A low pin count ("LPC") interface can also be provided by the PCH 1006 for connecting a Super I/O device 1008. The Super I/O device 1008 is responsible for providing a number of input/output ports, including a keyboard port, a mouse port, a serial interface, a parallel port, and other types of input/output ports. The LPC interface can also connect a computer storage media such as a ROM or a flash memory such as a NVRAM 1042 for storing firmware 104 that includes program code containing the basic routines that help to start up the computer 1000 and to transfer information between elements within the computer 1000 as discussed above with regard to FIG. 18.

It should be appreciated that the program modules disclosed herein, including the firmware 104, can include software instructions that, when loaded into the CPU 1002 and executed, transform a general-purpose computer 1000 into a special-purpose computer 1000 customized to facilitate all, or part of, the operations disclosed herein. As detailed throughout this description, the program modules can provide various tools or techniques by which the computer 1000 can participate within the overall systems or operating environments using the components, logic flows, and/or data structures discussed herein.

The CPU 1002 can be constructed from any number of transistors or other circuit elements, which can individually or collectively assume any number of states. More specifically, the CPU 1002 can operate as a state machine or finite-state machine. Such a machine can be transformed to a second machine, or a specific machine, by loading executable instructions contained within the program modules. These computer-executable instructions can transform the CPU 1002 by specifying how the CPU 1002 transitions between states, thereby transforming the transistors or other circuit elements constituting the CPU 1002 from a first machine to a second machine, wherein the second machine can be specifically configured to perform the operations disclosed herein. The states of either machine can also be transformed by receiving input from one or more user input devices, network interfaces (such as the Gigabit Ethernet Controller 1030), other peripherals, other interfaces, or one or more users or other actors. Either machine can also transform states, or various physical characteristics of various output devices such as printers, speakers, video displays, or otherwise.

Encoding the program modules can also transform the physical structure of the storage media. The specific transformation of physical structure can depend on various factors, in different implementations of this description. Examples of such factors can include, but are not limited to the technology used to implement the storage media, whether the storage media are characterized as primary or secondary storage, and the like. For example, if the storage media are implemented as semiconductor-based memory, the program modules can transform the physical state of the semiconductor main memory 1024 and/or NVRAM 1004. For example, the software can transform the state of transistors, capacitors, or other discrete circuit elements constituting the semiconductor memory.

As another example, the storage media can be implemented using magnetic or optical technology such as hard drives or optical drives. In such implementations, the program modules can transform the physical state of magnetic or optical media, when the software is encoded therein. These transformations can include altering the magnetic characteristics of particular locations within given magnetic media. These transformations can also include altering the physical features or characteristics of particular locations within given optical media to change the optical characteristics of those locations. It should be appreciated that various other transformations of physical media are possible without departing from the scope and spirit of the present description.

As described above, the PCH 1006 can include a system management bus 1034. As discussed above, when utilized to implement the managed computing system 102, the system management bus 1034 can include a BMC 106. As discussed above, the BMC 106 is a microcontroller that monitors operation of the computer 1000. In a more specific configuration, the BMC 106 monitors health-related aspects associated with the computer 1000, such as, but not limited to, the temperature of one or more components of the computer 1000, speed of rotational components (e.g., spindle motor, CPU fan, etc.) within the computer 1000, the voltage across or applied to one or more components within the computer 1000, and the available and/or used capacity of memory devices within the computer 1000. To accomplish these monitoring functions, the BMC 106 is communicatively connected to one or more components by way of the system management bus 1034 in some configurations.

In one configuration, these components include sensor devices 1038 for measuring various operating and performance-related parameters within the computer 1000. The sensor devices 1038 can be either hardware or software based components configured or programmed to measure or detect one or more of the various operating and performance-related parameters.

The BMC 106 functions as the master on the system management bus 1034 in most circumstances, but can also function as either a master or a slave in other circumstances. Each of the various components communicatively connected to the BMC 106 by way of the system management bus 1034 is addressed using a slave address. The system management bus 1034 is used by the BMC 106 to request and/or receive various operating and performance-related parameters from one or more components, such as the firmware 104, which are also communicatively connected to the system management bus 1034.

It should be appreciated that the functionality provided by the computer 1000 can be provided by other types of computing devices, including hand-held computers, smartphones, gaming systems, set top boxes, tablet computers, embedded computer systems, personal digital assistants, and other types of computing devices known to those skilled in the art. It is also contemplated that the computer 1000 might not include all the components shown in FIG. 10, can include other components that are not explicitly shown in FIG. 10, or might utilize an architecture completely different than that shown in FIG. 10.

Although the subject matter presented herein has been described in language specific to computer structural features, methodological acts, and computer readable media, it is to be understood that the present invention is not necessarily limited to the specific features, acts, or media described herein. Rather, the specific features, acts and mediums are disclosed as example forms.

The subject matter described above is provided by way of illustration only and should not be construed as limiting. Various modifications and changes can be made to the subject matter described herein without following the example configurations and applications illustrated and described, and without departing from the true spirit and scope of the present invention.

What is claimed is:

1. A computer-implemented method, comprising:
    receiving, at a baseboard management controller (BMC) of a computing device, a single multi-command request from a management client, the single multi-command request specifying a plurality of commands to be performed on one or more multi-mode dual in-line memory modules (DIMMs);
    responsive to receiving the multi-command request at the BMC, storing data identifying the plurality of commands in a data store maintained by the BMC;
    retrieving, by way of a firmware executing on the computing device, the data identifying the plurality of commands specified by the multi-command request from the data store maintained by the BMC; and
    issuing, by way of the firmware, the plurality of commands specified by the multi-command request to a firmware of the one or more multi-mode DIMMs.

2. The computer-implemented method of claim 1, wherein the multi-command request specifies that a first create namespace command and a second create namespace command are to be issued to the one or more multi-mode DIMMs.

3. The computer-implemented method of claim 2, wherein the multi-command request further specifies that a command for performing a diagnostic is also to be issued to the one or more multi-mode DIMMs in addition to the first create namespace command and the second create namespace command.

4. The computer-implemented method of claim 1, wherein the multi-command request specifies that a first delete namespace command and a second delete namespace command are to be issued to the one or more multi-mode DIMMs.

5. The computer-implemented method of claim 4, wherein the multi-command request further specifies that a command for performing a diagnostic on the one or more multi-mode DIMMs is also to be issued to the one or more multi-mode DIMMs in addition to the first delete namespace command and the second delete namespace command.

6. The computer-implemented method of claim 1, wherein the multi-command request specifies that a create goal command and a create namespace command are to be issued to the one or more multi-mode DIMMs.

7. The computer-implemented method of claim 6, wherein the multi-command request further specifies that a command for performing a diagnostic on the one or more multi-mode DIMMs is also to be issued to the one or more multi-mode DIMMs in addition to the create goal command and the create namespace command.

8. A non-transitory computer-readable storage medium having computer-executable instructions stored thereupon which, when executed by a computing system, cause the computing system to:
    receive, at a baseboard management controller (BMC) of the computing system, a single multi-command request from a management client, the single multi-command request specifying a plurality of commands to be performed on one or more multi-mode dual in-line memory modules (DIMMs) of the computing system;
    responsive to receiving the multi-command request at the BMC, store data identifying the plurality of commands in a data store maintained by the BMC;
    retrieve, by way of a firmware executing on the computing system, the data identifying the plurality of commands specified by the multi-command request from the data store maintained by the BMC; and
    issue, by way of the firmware, the plurality of commands to a firmware of the one or more multi-mode DIMMs.

9. The non-transitory computer-readable storage medium of claim 8, wherein the multi-command request specifies that a first create namespace command and a second create namespace command are to be issued to the one or more multi-mode DIMMs.

10. The non-transitory computer-readable storage medium of claim 9, wherein the multi-command request further specifies that a command for performing a diagnostic on the one or more multi-mode DIMMs is also to be issued to the one or more multi-mode DIMMs in addition to the first create namespace command and the second create namespace command.

11. The non-transitory computer-readable storage medium of claim 8, wherein the multi-command request specifies that a first delete namespace command and a second delete namespace command are to be issued to the one or more multi-mode DIMMs.

12. The non-transitory computer-readable storage medium of claim 11, wherein the multi-command request further specifies that a command for performing a diagnostic on the one or more multi-mode DIMMs is also to be issued to the one or more multi-mode DIMMs in addition to the first delete namespace command and the second delete namespace command.

13. The non-transitory computer-readable storage medium of claim 8, wherein the multi-command request specifies that a create goal command and a create namespace command are to be issued to the one or more multi-mode DIMMs.

14. The non-transitory computer-readable storage medium of claim 13, wherein the multi-command request further specifies that a command for performing a diagnostic on the one or more multi-mode DIMMs is to be issued to the one or more multi-mode DIMMs in addition to the create goal command and the create namespace command.

15. A computing system, comprising:
   one or more processors;
   a baseboard management controller (BMC);
   one or more multi-mode dual in-line memory module (DIMMs) supporting a volatile memory mode and a persistent memory mode; and
   at least one non-transitory computer-readable storage medium having computer-executable instructions stored thereupon which, when executed by the one or more processors, cause the computing system to:
      receive, at the BMC, a single multi-command request from a management client the multi-command request specifying a plurality of commands to be performed on the one or more multi-mode DIMMs;
      responsive to receiving the multi-command request at the BMC, store data identifying the plurality of commands in a data store maintained by the BMC;
      retrieve, by way of a firmware executing on the computing system, the data identifying the plurality of commands specified by the multi-command request from the data store maintained by the BMC; and
      issue, by way of the firmware, the plurality of commands specified by the multi-command request to a firmware of the one or more multi-mode DIMMs.

16. The computing system of claim 15, wherein the multi-command request specifies that a first create namespace command and a second create namespace command are to be issued to the one or more multi-mode DIMMs.

17. The computing system of claim 16, wherein the multi-command request further specifies that a command for performing a diagnostic on the one or more multi-mode DIMMs is to be issued to the one or more multi-mode DIMMs in addition to the first create namespace command and the second create namespace command.

18. The computing system of claim 15, wherein the multi-command request specifies that a first delete namespace command and a second delete namespace command are to be issued to the one or more multi-mode DIMMs.

19. The computing system of claim 18, wherein the multi-command request further specifies that a command for performing a diagnostic on the one or more multi-mode DIMMs is to be issued to the one or more multi-mode DIMMs in addition to the first delete namespace command and the second delete namespace command.

20. The computing system of claim 15, wherein the multi-command request specifies that a create goal command and a create namespace command are to be issued to the one or more multi-mode DIMMs.

* * * * *